United States Patent
Ochi et al.

(10) Patent No.: US 10,185,171 B2
(45) Date of Patent: Jan. 22, 2019

(54) LIGHT CONTROL MEMBER, METHOD OF MANUFACTURING LIGHT CONTROL MEMBER, APPARATUS FOR MANUFACTURING LIGHT CONTROL MEMBER, AND DISPLAY DEVICE

(71) Applicant: Sharp Kabushiki Kaisha, Sakai, Osaka (JP)

(72) Inventors: Sho Ochi, Sakai (JP); Yasushi Asaoka, Sakai (JP); Tsuyoshi Maeda, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 7 days.

(21) Appl. No.: 15/315,734

(22) PCT Filed: Jun. 3, 2015

(86) PCT No.: PCT/JP2015/066029
§ 371 (c)(1),
(2) Date: Dec. 2, 2016

(87) PCT Pub. No.: WO2015/186737
PCT Pub. Date: Dec. 10, 2015

(65) Prior Publication Data
US 2017/0115524 A1 Apr. 27, 2017

(30) Foreign Application Priority Data
Jun. 4, 2014 (JP) ................. 2014-115978

(51) Int. Cl.
G02B 5/02 (2006.01)
G02F 1/1335 (2006.01)
B32B 7/02 (2006.01)
G09F 9/00 (2006.01)
B32B 7/12 (2006.01)
G03F 7/20 (2006.01)
(Continued)

(52) U.S. Cl.
CPC .... G02F 1/133504 (2013.01); B29D 11/0073 (2013.01); B29D 11/00788 (2013.01);
(Continued)

(58) Field of Classification Search
CPC .. G02B 1/11; G02B 1/118; G02B 1/12; G02B 5/00; G02B 5/02; G02B 5/0205;
(Continued)

(56) References Cited

U.S. PATENT DOCUMENTS 5,521,726 A * 5/1996 Zimmerman ........ G02B 5/3025
349/159
5,944,405 A 8/1999 Takeuchi et al.
(Continued)

FOREIGN PATENT DOCUMENTS

JP 08-055507 A 2/1996
JP 2000-352608 A 12/2000
(Continued)

OTHER PUBLICATIONS

Official Communication issued in International Patent Application No. PCT/JP2015/066029, dated Aug. 18, 2015.

Primary Examiner — Thong Nguyen
(74) Attorney, Agent, or Firm — Keating & Bennett, LLP

(57) ABSTRACT

A light control member includes a light-transmissive first substrate, a light diffusing portion which is defined on a first surface of the first substrate, and a light shielding layer which is defined in a first region other than a second region in which the light diffusing portion is formed on the first surface and includes a light emitting end surface in contact with the first substrate, and a light incident end surface opposite the light emitting end surface and having a first area larger than a second area of the light emitting end surface, and structured such that a height from the light incident end surface to the light emitting end surface is larger than a layer thickness of the light shielding layer.

14 Claims, 26 Drawing Sheets

(51) Int. Cl.
*B29D 11/00* (2006.01)
*G02F 1/13363* (2006.01)

(52) U.S. Cl.
CPC .................. *B32B 7/02* (2013.01); *B32B 7/12* (2013.01); *G02B 5/0247* (2013.01); *G02B 5/0278* (2013.01); *G02F 1/133512* (2013.01); *G02F 1/133526* (2013.01); *G03F 7/70191* (2013.01); *G09F 9/00* (2013.01); *B32B 2307/412* (2013.01); *B32B 2457/202* (2013.01); *G02F 2001/133562* (2013.01); *G02F 2001/133635* (2013.01); *G02F 2202/28* (2013.01); *G02F 2413/02* (2013.01); *G02F 2413/05* (2013.01)

(58) Field of Classification Search
CPC .... G02B 5/021; G02B 5/0221; G02B 5/0273; G02B 5/0278; G02B 5/0284; G02B 5/0289; G02B 5/0294; G02B 27/00; G02B 27/0018; G03B 21/62; G03B 21/625; G02F 1/133504
See application file for complete search history.

(56) References Cited

U.S. PATENT DOCUMENTS

| | | | | |
|---|---|---|---|---|
| 6,417,966 | B1* | 7/2002 | Moshrefzadeh | G03B 21/62 359/453 |
| 6,636,355 | B2* | 10/2003 | Moshrefzadeh | G03B 21/625 359/453 |
| 7,428,367 | B2* | 9/2008 | Lubart | G02B 5/00 359/641 |
| 2013/0094174 | A1* | 4/2013 | Yamamoto | G02B 5/0215 362/19 |
| 2014/0111862 | A1* | 4/2014 | Yamamoto | G02F 1/133504 359/599 |
| 2015/0042935 | A1 | 2/2015 | Yamamoto et al. | |

FOREIGN PATENT DOCUMENTS

| | | |
|---|---|---|
| JP | 2001-134204 A | 5/2001 |
| JP | 2004-508691 A | 3/2004 |
| WO | 02/21883 A1 | 3/2002 |
| WO | 2012/157512 A1 * | 11/2012 |
| WO | 2013/146353 A1 | 10/2013 |

* cited by examiner

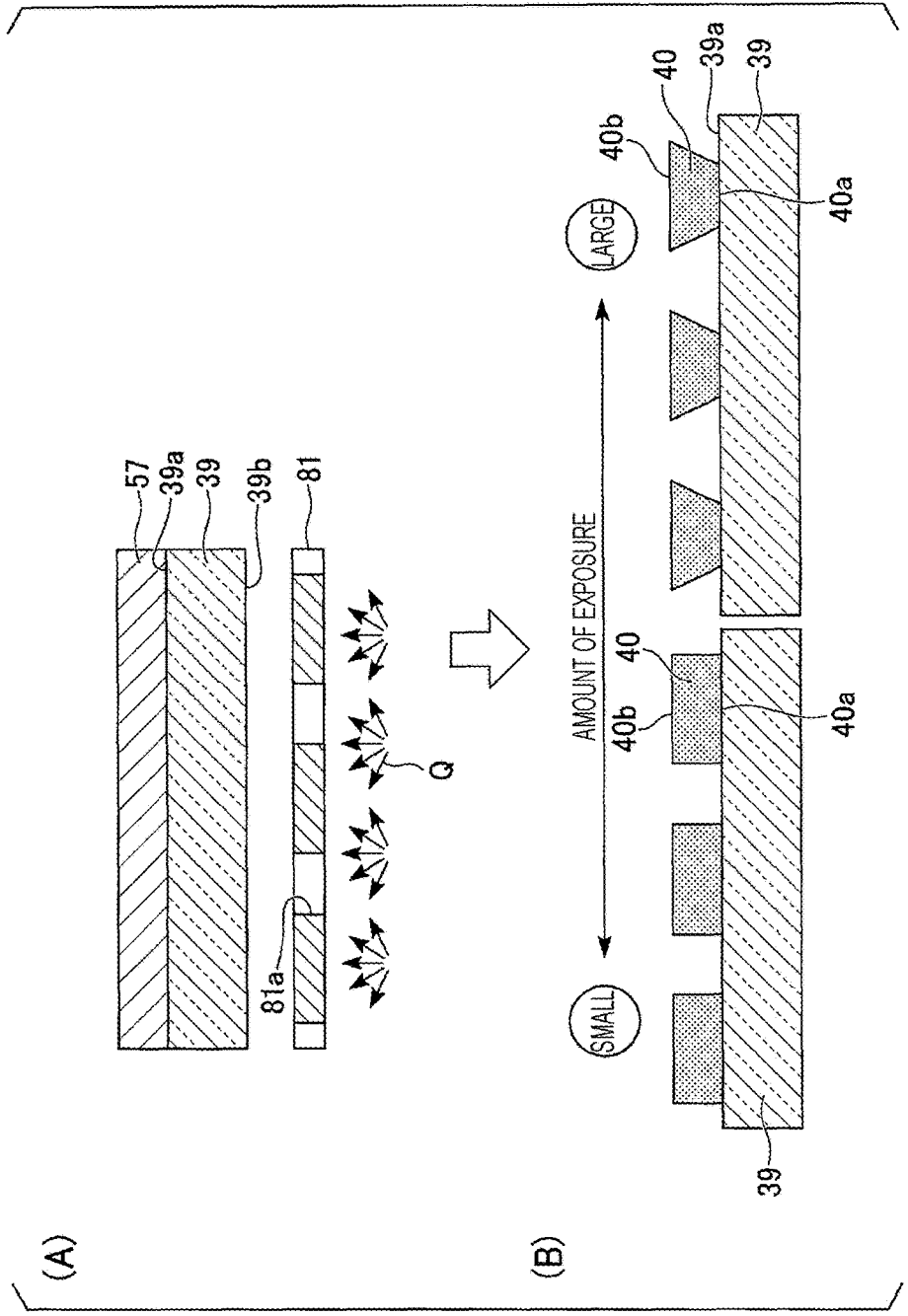

LIGHT CONTROL MEMBER, METHOD OF MANUFACTURING LIGHT CONTROL MEMBER, APPARATUS FOR MANUFACTURING LIGHT CONTROL MEMBER, AND DISPLAY DEVICE

TECHNICAL FIELD

The present invention relates to a light control member, a method of manufacturing a light control member, an apparatus for manufacturing a light control member, and a display device.

The application is based on Japanese Patent Application No. 2014-115978 filed on Jun. 4, 2014, the content of which is incorporated herein by reference.

BACKGROUND ART

Liquid crystal display devices have been widely used as displays for a portable electronic device including a mobile phone and the like, a television, and a personal computer. In general, the liquid crystal display device is excellent in viewability from the front, but has a narrow viewing angle. Accordingly, various measures for increasing a viewing angle are adopted. As one of the measures, a configuration has been proposed in which a member for controlling a diffusion angle of light emitted from a display unit such as a liquid crystal panel is included on a viewing side of the display unit. The member for controlling a diffusion angle of light will be hereinafter referred to as a light diffusing member.

Patent Literature 1 described below discloses a light diffusing member (light diffusing sheet) which is provided with a groove having a V-shaped cross-section and includes a light absorption layer provided in a portion of the groove. In the light diffusing member, a transparent sheet formed of polyethylene terephthalate (PET) or the like is disposed on a light incidence side and a light emission side of the light diffusing member. A portion of light which is vertically incident on the light diffusing member is totally reflected from a wall surface of the groove and is then emitted. Thereby, light emitted from the light diffusing member is diffused.

CITATION LIST

Patent Literature

PTL 1: Japanese Unexamined Patent Application Publication No. 2000-352608

SUMMARY OF INVENTION

Technical Problem

An example of a structure of a light diffusing member includes a structure in which an adhesion layer, a light diffusing portion, a light shielding layer, and a transparent substrate are provided from a liquid crystal panel side. Particularly, in a case where a portion of the transparent substrate covered with the light shielding layer is large, a bonded area between the transparent substrate and the light diffusing portion is small, and thus adhesiveness between the transparent substrate and the light diffusing portion tends to be decreased.

An aspect of the invention is contrived in view of the above-described problems of the related art, and an object thereof is to provide a light control member having high reliability by improving adhesiveness between a transparent substrate and a light diffusing portion, a method of manufacturing a light control member, an apparatus for manufacturing a light control member, and a display device.

Solution to Problem

A light control member according to an aspect of the invention includes a light-transmissive substrate, a light diffusing portion which is formed on a first surface of the substrate, and a light shielding layer which is formed in a region other than a region in which the light diffusing portion is formed on the first surface of the substrate. The light diffusing portion includes a light emitting end surface being in contact with the substrate, and a light incident end surface opposite the light emitting end surface and having an area larger than an area of the light emitting end surface, and is configured such that a height from the light incident end surface to the light emitting end surface is larger than a layer thickness of the light shielding layer. The light shielding layer includes an enlarged portion in a portion of the light shielding layer in a layer thickness direction, the enlarged portion being configured such that a sectional area which is cut by a plane parallel to the first surface of the substrate is larger than an area of a substrate side end surface of the light shielding layer.

In the light control member according to the aspect of the invention, an irregularity structure may be provided in at least one of a contact surface between the light emitting end surface of the light diffusing portion and the substrate and a contact surface between the substrate side end surface of the light shielding layer and the substrate.

A method of manufacturing a light control member according to an aspect of the invention includes forming a light shielding layer on a first surface of a light-transmissive substrate, forming a negative type photosensitive resin layer on the first surface of the substrate so as to cover the light shielding layer, radiating light from a second surface on a side opposite the first surface of the substrate, and developing the negative type photosensitive resin layer for which irradiation with light has been completed, and forming a light diffusing portion on the first surface of the substrate, the light diffusing portion including a light emitting end surface on the first surface of the substrate and including a light incident end surface having an area larger than an area of the light emitting end surface on a side opposite the substrate side. The forming of the light shielding layer includes forming a light shielding layer including an enlarged portion in which a sectional area which is cut by a plane parallel to the first surface of the substrate is larger than an area of a substrate side end surface of the light shielding layer.

In the method of manufacturing a light control member according to the aspect of the invention, a light shielding layer material film having photosensitivity may be formed on the first surface of the substrate as means for forming the light shielding layer having the enlarged portion, and the light shielding layer material film may be irradiated with parallel light with an amount of underexposure to light through a photomask disposed on the first surface side of the substrate.

In the method of manufacturing a light control member according to the aspect of the invention, a light shielding layer material film having photosensitivity may be formed on the first surface of the substrate as means for forming the light shielding layer having the enlarged portion, and the light shielding layer material film may be irradiated with diffused light through a photomask disposed on a second surface side of the substrate.

In the method of manufacturing a light control member according to the aspect of the invention, a light shielding layer material film having photosensitivity may be formed on the first surface of the substrate as means for forming the light shielding layer having the enlarged portion, the substrate having the light shielding layer material film formed thereon may be disposed so as to be inclined from a direction perpendicular to an optical axis of exposure light, and the light shielding layer material film may be irradiated with light through a photomask which is disposed on a second surface side of the substrate.

An apparatus for manufacturing a light control member according to an aspect of the invention is the apparatus for manufacturing the light control member including a light-transmissive substrate, a light diffusing portion which is formed on a first surface of the substrate, and a light shielding layer which is formed in a region other than a region in which the light diffusing portion is formed on the first surface of the substrate, in which the light diffusing portion includes a light emitting end surface being in contact with the substrate, and a light incident end surface opposite the light emitting end surface and having an area larger than an area of the light emitting end surface, and is configured such that a height from the light incident end surface to the light emitting end surface is larger than a layer thickness of the light shielding layer. The apparatus includes a photomask which is disposed on a second surface side of the substrate, an exposure device that irradiates with light the substrate having a light shielding layer material film formed thereon through the photomask, and a light diffusing member which is disposed between the photomask and the exposure device.

An apparatus for manufacturing a light control member according to an aspect of the invention is the apparatus for manufacturing the light control member including a light-transmissive substrate, a light diffusing portion which is formed on a first surface of the substrate, and a light shielding layer which is formed in a region other than a region in which the light diffusing portion is formed on the first surface of the substrate, in which the light diffusing portion includes a light emitting end surface being in contact with the substrate, and a light incident end surface opposite the light emitting end surface and having an area larger than an area of the light emitting end surface, and is configured such that a height from the light incident end surface to the light emitting end surface is larger than a layer thickness of the light shielding layer. The apparatus includes a photomask which is disposed on a second surface side of the substrate, and an exposure device that irradiates with light the substrate having a light shielding layer material film formed thereon through the photomask. The exposure device includes an inclination mechanism that inclines the substrate on which the light shielding layer material film is formed.

A display device according to an aspect of the invention includes a display unit and a light control member which is bonded to a light emission side of the display unit through an adhesion layer and emits light by further extending angle distribution of light incident from the display unit than angle distribution of the light before incidence. The light control member is the above-mentioned light control member.

The display device according to the aspect of the invention may further include a light-transmissive first substrate which is provided on the light emission side of the display unit without an adhesion layer in between, and is bonded to a light emission side of the light control member with an adhesion layer in between.

The display device according to the aspect of the invention may further include a light-transmissive first substrate which is bonded to a light incidence side of the light control member with a first adhesion layer in between, and the display unit which is bonded to a light incidence side of the first substrate with a second adhesion layer in between, in which adhesion of the second adhesion layer is lower than adhesion of the first adhesion layer.

Advantageous Effects of Invention

An aspect of the invention is to provide a light control member, a method of manufacturing a light control member, an apparatus for manufacturing a light control member, and a display device which have high reliability by improving adhesiveness between a transparent substrate and a light diffusing layer.

BRIEF DESCRIPTION OF DRAWINGS

FIGS. 23(A) and 23(B) are diagrams illustrating a method of forming a light shielding layer based on back exposure.

DESCRIPTION OF EMBODIMENTS

First Embodiment

Hereinafter, a first embodiment of the invention will be described with reference to FIGS. 1 to 19B.

In this embodiment, a description will be given by taking an example of a liquid crystal display device including a transmission type liquid crystal panel as a display device, A "liquid crystal panel" in this embodiment is equivalent to a "display unit" in claims.

Meanwhile, in all of the following drawings, scales of dimensions may be varied depending on components and illustrated in order to facilitate viewing of each component.

Figure 1:
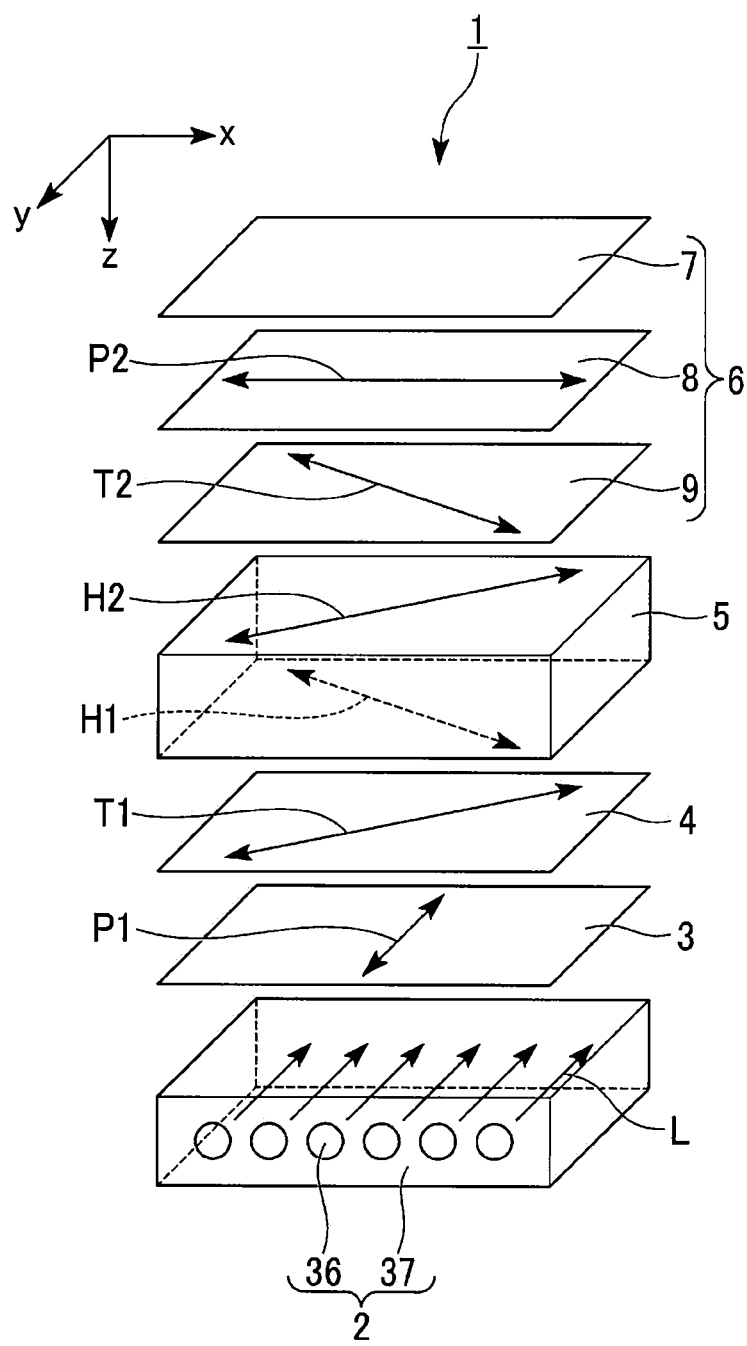
FIG. 1 is an exploded perspective view illustrating a liquid crystal display device according to a first embodiment of the invention.
Figure 2:
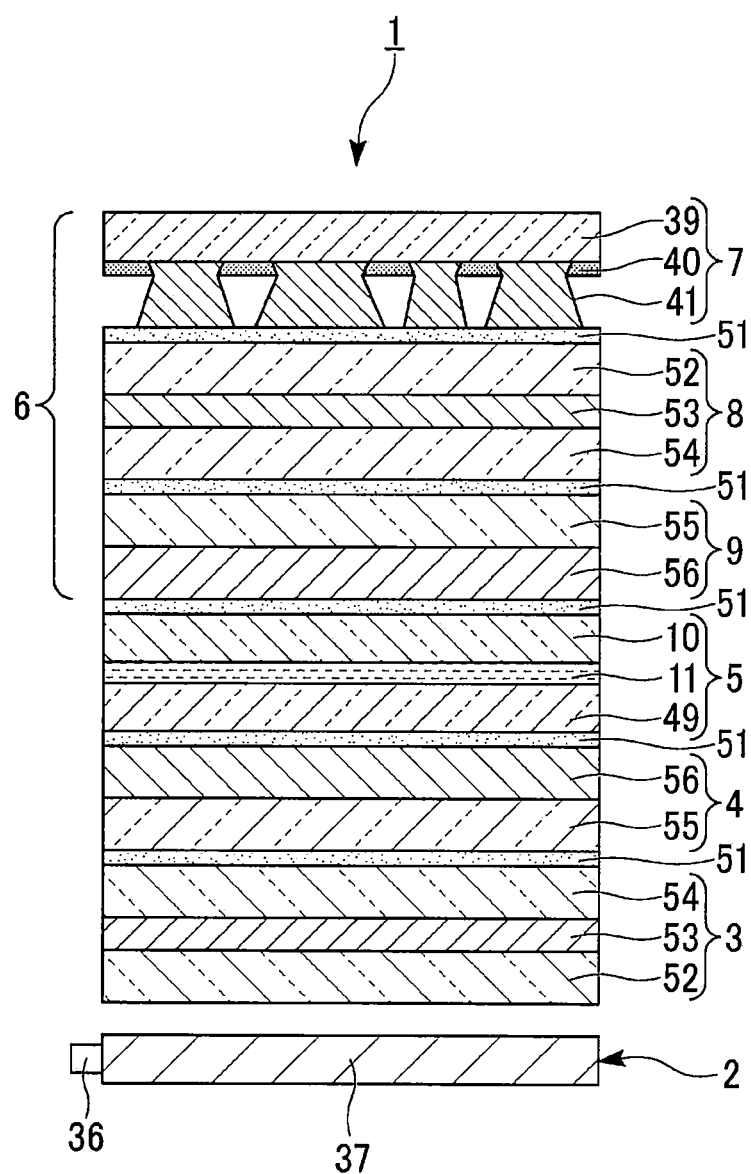
FIG. 2 is a sectional view illustrating the liquid crystal display device according to the first embodiment.

FIG. 1 is a perspective view when the liquid crystal display device of this embodiment is seen obliquely from above (viewing side). FIG. 2 is a sectional view of the liquid crystal display device.

A liquid crystal display device (display device) 1 of this embodiment includes a backlight 2, a first polarizing film 3, a first phase difference film 4, a liquid crystal panel 5, and a light diffusing member 6 as illustrated in FIGS. 1 and 2. In FIG. 1, members are drawn so as to be separated from each other in order to facilitate viewing of the drawing, but the light diffusing member 6 is a member in which a light diffusing film (light control member) 7, a second polarizing film 8, and a second phase difference film 9 are formed as one body.

In FIG. 1, the liquid crystal panel 5 is schematically illustrated in one plate shape, but a detailed structure thereof will be described later.

An observer views display from above the liquid crystal display device 1 in FIG. 1 in which the light diffusing member 6 is disposed. In the following description, a side on which the light diffusing member 6 is disposed is referred to as a viewing side, and a side on which the backlight 2 is disposed is referred to as a back side. In addition, in the following description, an x-axis is defined as a horizontal direction of a screen of the liquid crystal display device 1, a y-axis is defined as a vertical direction of a screen of the liquid crystal display device 1, and a z-axis is defined as a thickness direction of the liquid crystal display device 1.

In the liquid crystal display device 1 of this embodiment, light emitted from the backlight 2 is modulated by the liquid crystal panel 5, and a certain image, character, or the like is displayed by the modulated light. In addition, when light emitted from the liquid crystal panel 5 passes through the light diffusing member 6, the distribution (diffusion angle distribution) of emitted light is set to be in a state of being wider than before the light is incident on the light diffusing member 6, and thus the light is emitted from the light diffusing member 6.

Thereby, an observer can visually recognize display with a wide viewing angle.

(Liquid Crystal Panel)

Hereinafter, a specific configuration of the liquid crystal panel 5 will be described.

Here, an active-matrix transmission type liquid crystal panel will be described as an example. However, a liquid crystal panel capable of being applied to the invention is not limited to an active-matrix transmission type liquid crystal panel. A liquid crystal panel capable of being applied to the invention may be, for example, a semitransmission type (transmission and reflection type) liquid crystal panel. Further, the invention may be applied to a simple matrix type liquid crystal panel in which each pixel does not include a thin film transistor for switching (hereinafter, simply referred to as a TFT).

Figure 3:
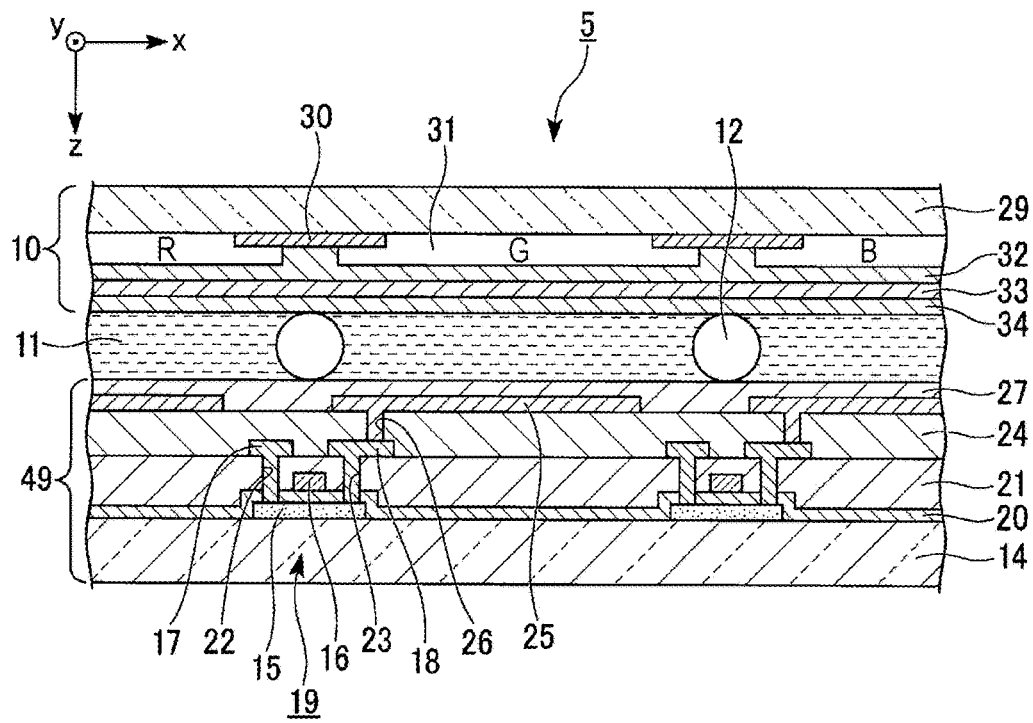
FIG. 3 is a sectional view of a liquid crystal panel.

FIG. 3 is a longitudinal section view of the liquid crystal panel 5.

As illustrated in FIG. 3, the liquid crystal panel 5 includes a TFT substrate 49, a color filter substrate 10, and a liquid crystal layer 11. The TFT substrate 49 functions as a switching element substrate. The color filter substrate 10 is disposed so as to face the TFT substrate 49. The liquid crystal layer 11 is interposed between the TFT substrate 49 and the color filter substrate 10. The liquid crystal layer 11 is sealed within a space surrounded by the TFT substrate 49, the color filter substrate 10, and a frame-shaped sealing member (not shown). The TFT substrate 49 and the color filter substrate 10 are bonded to each other at a predetermined interval by the sealing member.

The liquid crystal panel 5 of this embodiment performs display, for example, in a TN mode. Liquid crystal having positive dielectric anisotropy is used for the liquid crystal layer 11. A spacer 12 is disposed between the TFT substrate 49 and the color filter substrate 10. The spacer 12 has a spherical shape or a columnar shape. The spacer 12 holds a fixed interval between the TFT substrate 49 and the color filter substrate 10.

A display mode of the liquid crystal panel 5 of the invention is not limited to the above-mentioned TN mode. For example, a vertical alignment (VA) mode, a super twisted nematic (STN) mode, an in-plane switching (IPS) mode, a fringe field switching (FFS) mode, or the like may be used.

Although not illustrated in the drawing, a plurality of pixels are disposed in a matrix on the TFT substrate 49.

A pixel is a minimum unit region of display. A plurality of source bus lines are formed on the TFT substrate 49 so as to extend in parallel with each other. A plurality of gate bus lines are formed on the TFT substrate 49 so as to extend in parallel with each other. The plurality of gate bus lines are perpendicular to the plurality of gate bus lines. The plurality of source bus lines and the plurality of gate bus lines are formed in a lattice shape on the TFT substrate 49. A rectangular region partitioned by the source bus lines adjacent to each other and the gate bus lines adjacent to each other is one pixel. The source bus line is connected to a source electrode 17 of a TFT 19. The gate bus line is connected to a gate electrode 16 of the TFT 19.

The TFT 19 having a semiconductor layer 15, the gate electrode 16, the source electrode 17, a drain electrode 18, and the like is formed on a surface on the liquid crystal layer 11 side of a transparent substrate 14 constituting the TFT substrate 49. For example, a glass substrate can be used as the transparent substrate 14. The semiconductor layer 15 is formed on the transparent substrate 14. A semiconductor material such as continuous grain silicon (CGS), low-temperature poly-silicon (LPS), or amorphous silicon (α-Si) is used as the material of the semiconductor layer 15.

A gate insulating film 20 is formed on the transparent substrate 14 so as to cover the semiconductor layer 15.

For example, a silicon oxide film, a silicon nitride film, a laminated film thereof, or the like is used as the material of the gate insulating film 20. The gate electrode 16 is formed on the gate insulating film 20 so as to face the semiconductor layer 15. For example, a laminated film of tungsten (W)/tantalum nitride (Tan), molybdenum (Mo), titanium (Ti), aluminum (Al), or the like is used as the material of the gate electrode 16.

A first insulating interlayer 21 is formed on the gate insulating film 20 so as to cover the gate electrode 16. For example, a silicon oxide film, a silicon nitride film, a laminated film thereof, or the like is used as the material of the first insulating interlayer 21. The source electrode 17 and the drain electrode 18 are formed on the first insulating interlayer 21. A contact hole 22 and a contact hole 23 are formed in the first insulating interlayer 21 and the gate insulating film 20 so as to penetrate the first insulating interlayer 21 and the gate insulating film 20. The source electrode 17 is connected to a source region of the semiconductor layer 15 through the contact hole 22. The drain electrode 18 is connected to a drain region of the semiconductor layer 15 through the contact hole 23. A conductive material which is the same as that of the gate electrode 16 mentioned above is used as the materials of the source electrode 17 and the drain electrode 18.

A second insulating interlayer 24 is formed on the first insulating interlayer 21 so as to cover the source electrode 17 and the drain electrode 18. A material which is the same as that of the first insulating interlayer 21 mentioned above, or an organic insulating material is used as the material of the second insulating interlayer 24. A pixel electrode 25 is formed on the second insulating interlayer 24. A contact hole 26 is formed in the second insulating interlayer 24 so as to penetrate the second insulating interlayer 24. The pixel electrode 25 is connected to the drain electrode 18 through the contact hole 26. The pixel electrode 25 is connected to the drain region of the semiconductor layer 15 using the drain electrode 18 as a relay electrode. A transparent conductive material such as an indium tin oxide (ITO) or indium zinc oxide (IZO) is used as the material of the pixel electrode 25.

With such a configuration, when scanning signals are supplied through the gate bus lines and the TFT 19 is set to be in an on-state, image signals supplied to the source electrode 17 through the source bus lines are supplied to the pixel electrode 25 through the semiconductor layer 15 and the drain electrode 18. In addition, an alignment film 27 is formed on the entire surface of the second insulating interlayer 24 so as to cover the pixel electrode 25. The alignment film 27 has an alignment regulating force for horizontally aligning liquid crystal molecules constituting the liquid crystal layer 11. Meanwhile, the TFT 19 may be a top gate type TFT illustrated in FIG. 3 or may be a bottom gate type TFT.

On the other hand, a black matrix 30, a color filter 31, a planarizing layer 32, a counter electrode 33, and an alignment film 34 are sequentially formed on a surface on the liquid crystal layer 11 side of a transparent substrate 29 constituting the color filter substrate 10. The black matrix 30 has a function of shielding the transmission of light in a region between pixels. The black matrix 30 is formed of a photoresist obtained by dispersing a metal, such as chrome (Cr) or a multi-layered film of Cr/chromium oxide, or carbon particles in a photosensitive resin.

The color filter 31 includes pigments of red (R), green (G), and blue (B). The color filter 31 of any one of R, G, and B is disposed so as to face one pixel electrode 25 on the TFT substrate 49. Meanwhile, the color filter 31 may be configured to include three colors of R, G, and B or more colors.

The planarizing layer 32 is constituted by an insulating film that covers the black matrix 30 and the color filter 31. The planarizing layer 32 has a function of performing planarizing by alleviating a step generated due to the black matrix 30 and the color filter 31. The counter electrode 33 is formed on the planarizing layer 32. A transparent conductive material which is the same as that of the pixel electrode 25 is used as the material of the counter electrode 33. The alignment film 34 is formed on the entire surface of the counter electrode 33. The alignment film 34 has an alignment regulating force of horizontally aligning liquid crystal molecules constituting the liquid crystal layer 11.

Referring back to FIG. 1, the backlight 2 is constituted by a light source 36, such as a light emitting diode or a cold cathode tube, and a light guiding plate 37 that guides light emitted from the light source 36 to the liquid crystal panel 5. The light guiding plate 37 has an emission surface from which light is emitted toward the liquid crystal panel 5, a back surface opposite the emission surface, and a plurality of prisms (not shown) which are formed on the back surface. The prism on the back surface has two inclined surfaces (not shown) which are inclined at predetermined different angles with respect to the emission surface, and light emitted from the backlight 2 has a high intensity on a display surface in a normal direction and has a high directivity.

Meanwhile, the backlight 2 may be an edge-light type backlight in which the light source 36 is disposed on an end surface of the light guiding plate 37, or may be a direct type backlight in which a light source is disposed directly below a light guide unit.

It is desired that a so-called backlight which is given directivity by controlling a light emission direction is used as the backlight 2 in this embodiment. It is possible to reduce blurring by using a directivity backlight that makes collimated light or substantially collimated light incident on a light diffusing portion 41 of the light diffusing film 7, and to increase light utilization efficiency. The luminance distribution of the above-mentioned directivity backlight will be described later.

(Light Diffusing Member)

Hereinafter, the light diffusing member 6 will be described in detail.

Figure 4:
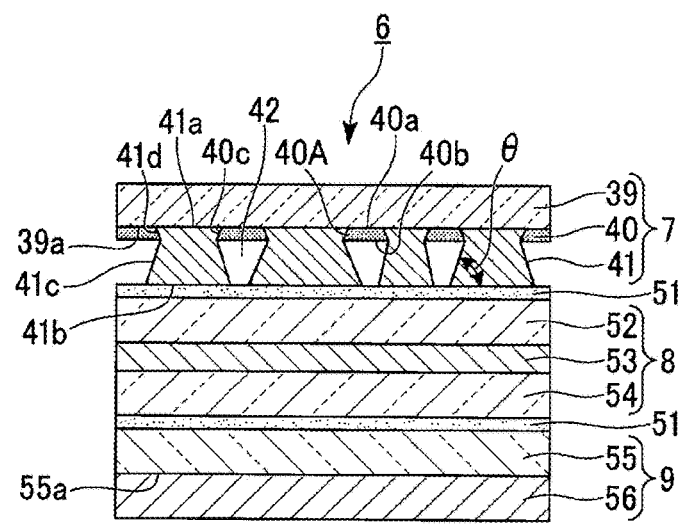
FIG. 4 is a sectional view illustrating a light diffusing member according to the first embodiment.
Figure 5:
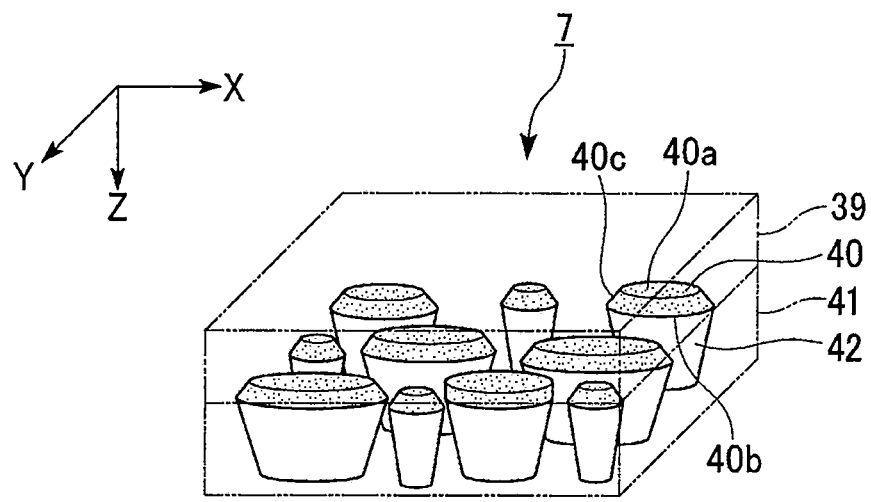
FIG. 5 is a perspective view illustrating a light diffusing film.

FIG. 4 is a sectional view of the light diffusing member 6. FIG. 5 is a perspective view illustrating the light diffusing film 7.

As illustrated in FIG. 4, the light diffusing member 6 is configured such that the light diffusing film 7, the second polarizing film 8, and the second phase difference film 9 are laminated with an adhesive layer 51 in between.

The light diffusing film 7 includes a first substrate 39, a plurality of light shielding layers 40, and a light diffusing portion 41 as illustrated in FIGS. 4 and 5. The plurality of light shielding layers 40 are formed on a first surface 39a (surface on the back side) of the first substrate 39. The light diffusing portion 41 is formed in a region other than a region in which the light shielding layer 40 is formed, on the first surface 39a of the first substrate 39.

The light diffusing film 7 is disposed on the second polarizing film 8 with an attitude that a side having the light diffusing portion 41 provided thereon faces the second polarizing film 8 side and a side having the first substrate 39 provided thereon faces a viewing side, as illustrated in FIGS. 2 and 4. The light diffusing film 7 is fixed to the second polarizing film 8 through the adhesive layer 51.

A transparent resin substrate, such as a triacetyl cellulose (TAC) film, polyethylene terephthalate (PET), polycarbonate (PC), polyethylene naphthalate (PEN), or a polyether sulfone (PES) film, is preferably used as the first substrate 39. The first substrate 39 serves as a substrate at the time of applying the material of the light shielding layer 40 or the light diffusing portion 41 later in a manufacturing process. The first substrate 39 needs to have heat resistance and mechanical strength in a heat treatment process during the manufacturing process. Accordingly, not only a resin substrate but also a glass substrate or the like may be used as the first substrate 39. Here, it is preferable that the first substrate 39 has such a small thickness that heat resistance or mechanical strength is not impaired. The reason is because there is more concern that display blurring may occur as the thickness of the first substrate 39 becomes smaller. In addition, it is preferable that the total light transmittance of the first substrate 39 is 90% or higher according to JIS K7361-1. When the total light transmittance is 90% or higher, sufficient transparency is obtained. In this embodiment, a transparent resin substrate having a thickness of 100 μm is generally used as an example.

The light shielding layer 40 has a sectional shape of substantially a trapezoid shape, and has a shape in which a sectional area of a cut surface parallel to the first surface 39a of the first substrate 39 side becomes larger as a distance from the first substrate 39 side increases. In other words, the light shielding layer 40 has a reversely tapered shape in which the area of a panel side end surface 40b, opposite a substrate side end surface 40a, is larger than the area of the substrate side end surface being in contact with the first surface 39a of the first substrate 39. A reversely tapered surface 40c connecting the substrate side end surface 40a and the panel side end surface 40b to each other is in contact with the light diffusing portion 41 to be described later. A portion formed by the reversely tapered surface 40c and a peripheral edge portion of the panel side end surface 40b is an enlarged portion 40A that expands further outward than the outer periphery of the substrate side end surface 40a when seen in plan view.

The light shielding layer 40 is randomly disposed when seen in the direction normal to a principal surface of the first substrate 39. As an example, the light shielding layer 40 is formed of an organic material, such as black resist or black ink, which has light absorptivity and photosensitivity. In addition, an organic material for forming the light shielding layer 40 may include an ultraviolet absorbing material that absorbs ultraviolet rays.

The light shielding layer 40 can also be formed by printing (a gravure printing method, an ink jet method, or the like), but a method of exposure and developing using a photomask is most preferably used.

The light diffusing portion 41 is formed of an organic material, such as an acrylic resin or an epoxy resin, which has light transmissivity and photosensitivity. In addition, it is preferable that the total light transmittance of the light diffusing portion 41 is 90% or higher according to JIS K7361-1. When the total light transmittance is 90% or higher, sufficient transparency is obtained.

The light diffusing portion 41 includes a light emitting end surface 41a, a light incident end surface 41b, a reflective surface 41c, and an inclined surface 41d, as illustrated in FIG. 4. The light emitting end surface 41a is a surface which is in contact with the first substrate 39. The light incident end surface 41b is a surface opposite the light emitting end surface 41a. The reflective surface 41c is a tapered side surface which is a portion of the side surface of the light diffusing portion 41. The reflective surface 41c is a surface that reflects light incident from the light incident end surface 41b.

The inclined surface 41d is a surface continuously extending from the reflective surface 41c and is a portion forming a reversely tapered shape with respect to the reflective surface 41c in the side surface of the light diffusing portion 41. The entirety of the inclined surface 41d is in contact with the reversely tapered surface 40c of the light shielding layer 40 mentioned above. The invention is not limited thereto, and a configuration may also be adopted in which a portion of the inclined surface 41d is in contact with the reversely tapered surface 40c of the light shielding layer 40.

In this embodiment, the area of the light incident end surface 41b is larger than the area of the light emitting end surface 41a. However, the invention is not limited thereto, and the light incident end surface 41b and the light emitting end surface 41a may have substantially the same area. In addition, the area of the light emitting end surface 41a may be larger than the area of the light incident end surface 41b.

The light diffusing portion 41 is a portion that contributes to the transmission of light in the light diffusing film 7. That is, light incident on the light diffusing portion 41 is guided in a state of being substantially trapped in the light diffusing portion 41 and is emitted while being totally reflected from the reflective surface 41c of the light diffusing portion 41.

The light diffusing film 7 is disposed such that the first substrate 39 faces a viewing side.

It is preferable that an inclination angle θ (angle between the light incident end surface 41b and the reflective surface 41c) of the reflective surface 41c of the light diffusing portion 41 is equal to or greater than 75 degrees and equal to or less than 90 degrees. In this embodiment, the inclination angle θ of the reflective surface 41c of the light diffusing portion 41 is 75 degrees. However, the inclination angle θ of the reflective surface 41c of the light diffusing portion 41 is not particularly limited as long as the angle is an angle at which incident light can be sufficiently diffused when being emitted from the light diffusing film 7. In this embodiment, the inclination angle θ of the reflective surface 41c of the light diffusing portion 41 is substantially fixed.

A height from the light incident end surface 41b to the light emitting end surface 41a of the light diffusing portion 41 is set to be larger than the layer thickness of the light shielding layer 40. In a case of this embodiment, the layer thickness of the light shielding layer 40 is approximately 150 nm as an example. A height from the light incident end surface 41b to the light emitting end surface 41a of the light diffusing portion 41 is approximately 20 μm as an example. A portion surrounded by the reflective surface 41c and the light shielding layer 40 of the light diffusing portion 41 is configured as a cavity 42.

In this embodiment, a configuration is adopted in which an adhesive force of the light diffusing portion 41 with respect to the first surface 39a of the first substrate 39 is higher than an adhesive force of the substrate side end surface 40a of the light shielding layer 40 with respect to the first surface 39a of the first substrate 39.

Meanwhile, it is desired that a refractive index of the first substrate 39 and a refractive index of the light diffusing portion 41 are substantially equal to each other. The reason is as follows. For example, a case where a refractive index of the first substrate 39 and a refractive index of the light diffusing portion 41 are greatly different from each other is considered. In this case, when light incident from the light incident end surface 41b is emitted from the light diffusing portion 41, unnecessary refraction or reflection of light may occur at an interface between the light diffusing portion 41 and the first substrate 39. In this case, there is a concern that a desired viewing angle may not be obtained, or the amount of emitted light may be reduced.

In a case of this embodiment, air is present in the cavity 42 (the outside of the light diffusing portion 41). Accordingly, assuming that the light diffusing portion 41 is formed of, for example, a transparent acrylic resin, the reflective surface 41c of the light diffusing portion 41 is an interface between the transparent acrylic resin and air. Here, the cavity 42 may be filled with another low refractive index material. However, a difference in refractive index at an interface between the inside and the outside of the light diffusing portion 41 is maximized in a case where air is present outside the light diffusing portion, rather than a case where any low refractive index material is present outside the light diffusing portion.

Therefore, a critical angle is minimized in the configuration of this embodiment on the basis of the Snell's law, and an incident angle range in which light is totally reflected from the reflective surface 41c of the light diffusing portion 41 becomes widest. As a result, the loss of light is further suppressed, and thus it is possible to obtain high luminance.

Meanwhile, in this embodiment, the presence of a low refractive index material indicates that the vicinity of the light diffusing portion 41 is set to be in a low refractive index state in order to allow light to be totally reflected. Accordingly, it is assumed that a state where the cavity 42 is filled with an inert gas, such as nitrogen, instead of air is also included. Alternatively, the inside of the cavity 42 may be set to be in a vacuum state or a state where pressure is further reduced than air.

Figure 6:
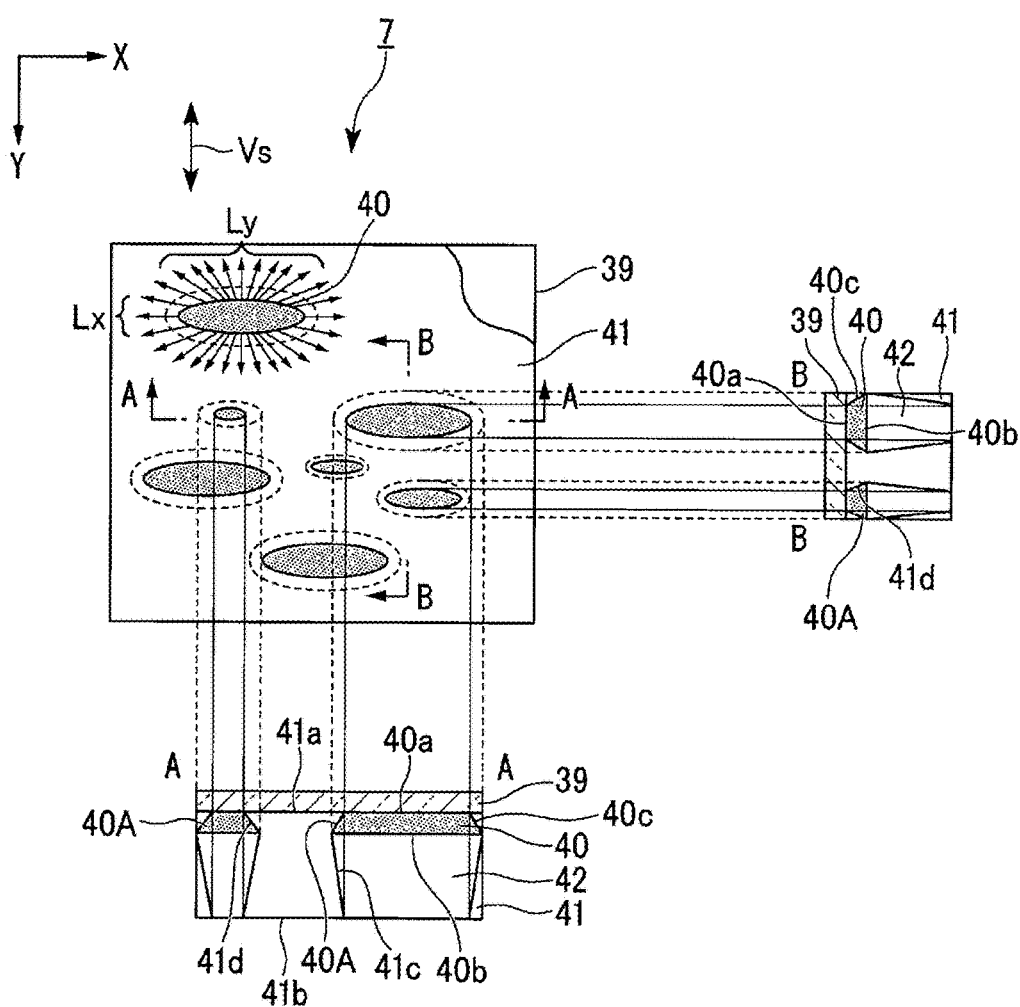
FIG. 6 illustrates a plan view of a light diffusing film and sectional views thereof when seen in two directions.

FIG. 6 is a schematic diagram illustrating the light diffusing film 7. In FIG. 6, an upper diagram on the left side is a plan view of the light diffusing film 7. A lower diagram on the left side is a sectional view taken along line A-A in the plan view on the upper left side. An upper diagram on the right side is a sectional view taken along line B-B in the plan view on the upper left side.

The light diffusing film 7 is configured such that the plurality of light shielding layers 40 are scattered on a surface of the first substrate 39, as illustrated on the upper left side of FIG. 6. A planar shape of the light shielding layer 40 when seen in the direction normal to the first substrate 39 is an elliptic shape. The light shielding layer 40 has a long axis and a short axis. Here, the long axis is the longest axis in the planar shape of the light shielding layer 40 when seen in the direction normal to the first substrate 39.

The short axis is the shortest axis in the planar shape of the light shielding layer 40 when seen in the direction normal to the first substrate 39. In the light diffusing film 7, ratios of the short axes to the long axes in the respective light shielding layers 40 are substantially equal to each other.

As illustrated on the lower left side and the upper right side of FIG. 6, a portion equivalent to the lower side of the light shielding layer 40 is the cavity 42 having an elliptical frustum shape. The light diffusing film 7 has a plurality of cavities 42. The light diffusing portion 41 is continuously provided in a portion other than the plurality of cavities 42.

Elliptical long axis directions constituting the planar shapes of the light shielding layers 40 are aligned in substantially an X-direction. Hereinafter, the elliptical long axis direction may be referred to as a long axis direction of the light shielding layer. Elliptical short axis directions constituting the planar shapes of the light shielding layers 40 are aligned in substantially a Y-direction. Hereinafter, the elliptical short axis direction may be referred to as a short axis direction of the light shielding layer. Thus, considering the direction of the reflective surface 41c of the light diffusing portion 41, a proportion of the reflective surface 41c along the X-direction in the reflective surface 41c of the light diffusing portion 41 is higher than a proportion of the reflective surface 41c along the Y-direction. Accordingly, the amount of light Ly which is reflected from the reflective surface 41c along the X-direction and is diffused in the Y-direction is larger than the amount of light Lx which is reflected from the reflective surface 41c along the Y-direction and is diffused in the X-direction.

Accordingly, an azimuth angle direction Vs in which the diffusibility of the light diffusing film 7 is highest is the Y-direction which is the short axis direction of the light shielding layer 40. A polar angle direction is arbitrary. Meanwhile, definitions of a polar angle and an azimuth angle will be described later in detail.

Meanwhile, in a case where the planar shape of the light shielding layer 40 is a circular shape, a proportion of the reflective surface 41c along the X-direction in the reflective surface 41c of the light diffusing portion 41 is equal to a proportion of the reflective surface 41c along the Y-direction. Accordingly, light which is reflected from the reflective surface 41c along the X-direction and is diffused in the Y-direction is equal to light which is reflected from the reflective surface 41c along the Y-direction and is diffused in the X-direction. In other words, light is isotropically reflected from the reflective surface 41c when seen in the direction normal to the substrate 39. Therefore, an azimuth angle direction in which the diffusibility of the light diffusing portion 41 is highest is not present.

Referring back to FIG. 4, the second polarizing film 8 is configured such that a second substrate 52, a polarizing layer 53, and a fourth substrate 54 are laminated in this order from the light diffusing film 7 side. The second substrate 52 and the fourth substrate 54 have light transmissivity. The second substrate 52 is disposed on the light incident end surface 41b side of the light diffusing portion 41 of the light diffusing film 7. The polarizing layer 53 has a transmission axis and an absorption axis which are perpendicular to each other, and is provided on a first surface of the second substrate 52. The polarizing layer 53 is interposed between the fourth substrate 54 and the second substrate 52.

A transparent resin film such as TAC, PET, PC, PEN, or PES is preferably used for the second substrate 52 and the fourth substrate 54. The second substrate 52 and the fourth substrate 54 may be the same substrate, or may be different substrates. In this embodiment, a TAC film having a thickness of 100 μm is used for the second substrate 52 and the fourth substrate 54. The polarizing layer 53 is constituted by, for example, a polyvinyl alcohol layer having iodine adsorbed and aligned thereon.

The second phase difference film 9 is configured such that a third substrate 55 and a phase difference layer 56 are laminated in this order from the second polarizing film 8 side. The third substrate 55 is disposed on a side opposite a side on which the light diffusing film 7 of the second polarizing film 8 is disposed. The third substrate 55 has light transmissivity. The phase difference layer 56 is constituted by an optically negative uniaxial birefringent body which is provided on a first surface 55a of the third substrate 55. The phase difference layer 56 is configured such that an alignment direction of the birefringent body varies in the thickness direction.

The third substrate 55 of the second phase difference film 9 is bonded to the fourth substrate 54 of the second polarizing film 8 through the adhesive layer 51.

A transparent resin film such as TAC, PET, PC, PEN, or PES is preferably used for the third substrate 55. The third substrate 55 may be the same substrate as the second substrate 52 and the fourth substrate 54, or may be a different substrate. In this embodiment, a TAC film having a thickness of 100 μm is used for the third substrate 55. The phase difference layer 56 is constituted by, for example, a layer in which a discotic liquid crystal compound which is an optically negative uniaxial birefringent body is hybrid-aligned.

Referring to FIG. 2, the first polarizing film 3 and the first phase difference film 4 are provided in this order from the backlight 2 side between the backlight 2 and the liquid crystal panel 5. The first phase difference film 4 is bonded to the liquid crystal panel 5 through the adhesive layer 51. The first polarizing film 3 is bonded to the first phase difference film 4 through the adhesive layer 51. The configuration of the first polarizing film 3 is the same as that of the second polarizing film 8 mentioned above. The configuration of the first phase difference film 4 is the same as that of the second phase difference film 9 mentioned above. Therefore, this configuration is the same as a configuration in which the light diffusing film 7 is omitted from the light diffusing member 6 provided on the viewing side, that is, a configuration in which a laminated body of the second polarizing film 8 and the second phase difference film 9 is provided so as to be turned inside out between the backlight 2 and the liquid crystal panel 5.

The first polarizing film 3 functions as a polarizer. When an angle is represented counterclockwise on the basis of a positive direction of the x-axis direction, an absorption axis P1 of the first polarizing film 3 is set in a direction of 90 degrees to 270 degrees, as illustrated in FIG. 1. On the other hand, the second polarizing film 8 in the light diffusing member 6 functions as an analyzer. An absorption axis P2 of the second polarizing film 8 is disposed so as to be perpendicular to the absorption axis P1 of the first polarizing film 3. The absorption axis P2 of the second polarizing film 8 is set in a direction of 0 degrees to 180 degrees. That is, the absorption axis P1 of the first polarizing film 3 and the absorption axis P2 of the second polarizing film 8 are arranged in a crossed-Nicols state.

In FIG. 1, an alignment control direction of the alignment film 27 of the TFT substrate 49 is indicated by an arrow H1. Hereinafter, the alignment control direction of the alignment film 27 of the TFT substrate 49 will be referred to as an alignment control direction H1. On the other hand, an alignment control direction of the alignment film 34 of the color filter substrate 10 is indicated by an arrow H2. Hereinafter, the alignment control direction of the alignment film 34 of the color filter substrate 10 will be referred to as an alignment control direction H2.

Alignment processing such as rubbing is performed on the alignment film 27 so that the alignment control direction H1 is set to a direction of 135 degrees to 315 degrees. On the other hand, alignment processing such as rubbing is performed on the alignment film 34 so that the alignment control direction H2 is set to a direction of 45 degrees to 225 degrees.

In addition, a direction of a slow axis of the first phase difference film 4 is indicated by an arrow T1. Hereinafter, a direction of a slow axis of the first phase difference film 4 will be referred to as a slow axis direction T1. A direction of a slow axis of the second phase difference film 9 is indicated by an arrow T2. Hereinafter, a direction of a slow axis of the second phase difference film 9 will be referred to as a slow axis direction T2.

The first phase difference film 4 is disposed such that the slow axis direction T1 faces in a direction of 45 degrees to 225 degrees. That is, the slow axis direction T1 and the alignment control direction H2 conform to each other. The second phase difference film 9 is disposed such that the slow axis direction T2 faces in a direction of 135 degrees to 315 degrees.

That is, the slow axis direction T2 and the alignment control direction H1 conform to each other.

Focusing on the light diffusing member 6, the direction of the absorption axis P2 of the second polarizing film 8 is a direction of 0 degrees to 180 degrees, and a transmission axis direction of the second polarizing film 8 is a direction of 90 degrees to 270 degrees. The slow axis direction T2 of the second phase difference film 9 is a direction of 135 degrees to 315 degrees. The slow axis of the second phase difference film 9 is at an azimuth between the transmission axis direction and an absorption axis direction of the second polarizing film 8. Particularly, in a case of this embodiment, an azimuth angle between the slow axis direction of the second phase difference film 9 and the transmission axis of the second polarizing film 8 is 45 degrees.

Figure 7A:
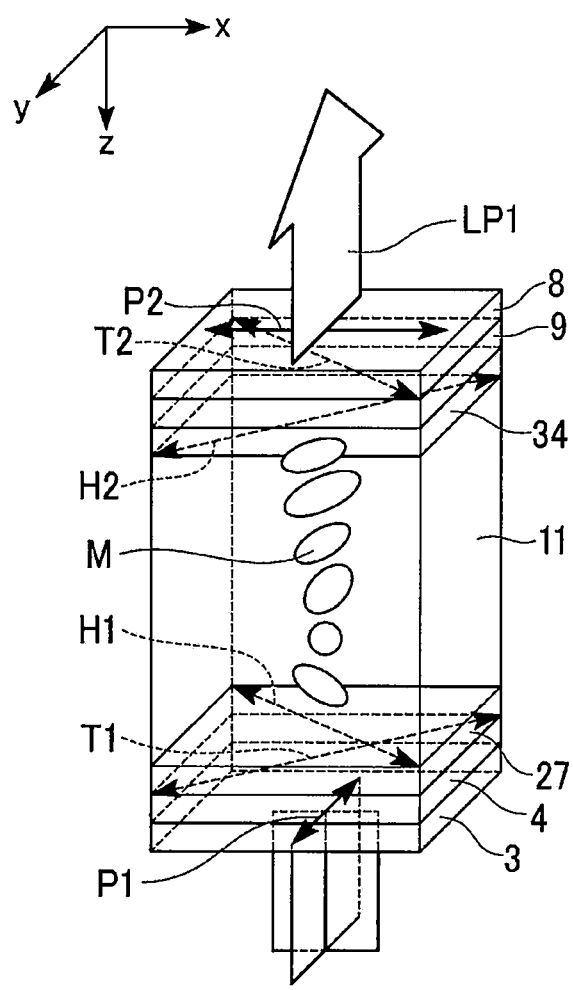
FIG. 7A is a first diagram illustrating the operation of the liquid crystal panel.
Figure 7B:
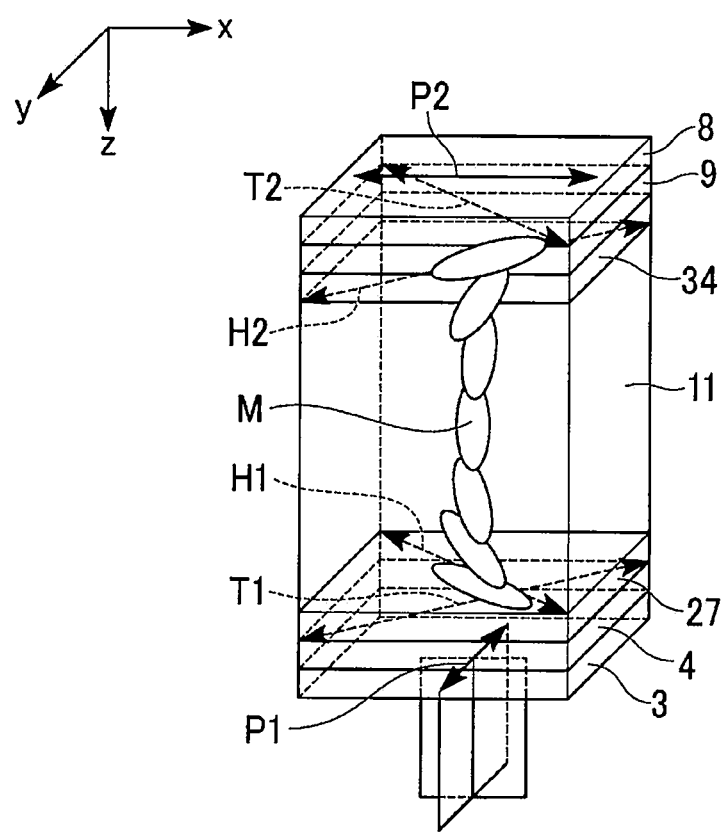
FIG. 7B is a second diagram illustrating the operation of the liquid crystal panel.

FIGS. 7A and 7B are diagrams illustrating the operation of the liquid crystal panel 5.

FIG. 7A is a diagram illustrating a state where a voltage is not applied to the liquid crystal panel 5 (between the pixel electrode 25 and the counter electrode 33 illustrated in FIG. 3) (non-voltage application state). FIG. 7B is a diagram illustrating a state where a fixed voltage is applied to the liquid crystal panel 5 (voltage application state). Meanwhile, in FIGS. 7A and 7B, a sign M denotes a liquid crystal molecule constituting the liquid crystal layer 11.

The liquid crystal molecule M is twisted at 90 degrees between the alignment film 27 and the alignment film 34 in a non-voltage application state, as illustrated in FIG. 7A. At this time, a polarization plane of linearly polarized light passing through the first polarizing film 3 having a transmission axis (absorption axis P1 in a direction of 90 degrees to 270 degrees) in a direction of 0 degrees to 180 degrees is rotated 90 degrees due to optical rotation of the liquid crystal layer 11. Thereby, the linearly polarized light passing through the first polarizing film 3 passes through the second polarizing film 8 having a transmission axis (absorption axis P2 in a direction of 0 degrees to 180 degrees) in a direction of 90 degrees to 270 degrees. As a result, white display is performed in a non-voltage application state.

The liquid crystal molecule M is brought into a standing state in a direction along an electric field between the alignment film 27 and the alignment film 34 in a voltage application state, as illustrated in FIG. 7B. At this time, the polarization plane of the linearly polarized light passing through the first polarizing film 3 having a transmission axis in a direction of 0 degrees to 180 degrees is not rotated. Accordingly, the linearly polarized light passing through the first polarizing film 3 does not pass through the second polarizing film 8 having a transmission axis in a direction of 90 degrees to 270 degrees. As a result, black display is performed in a voltage application state.

As described above, it is possible to display an image by switching between white display and black display by controlling application or non-application of a voltage for each pixel.

Figure 8:
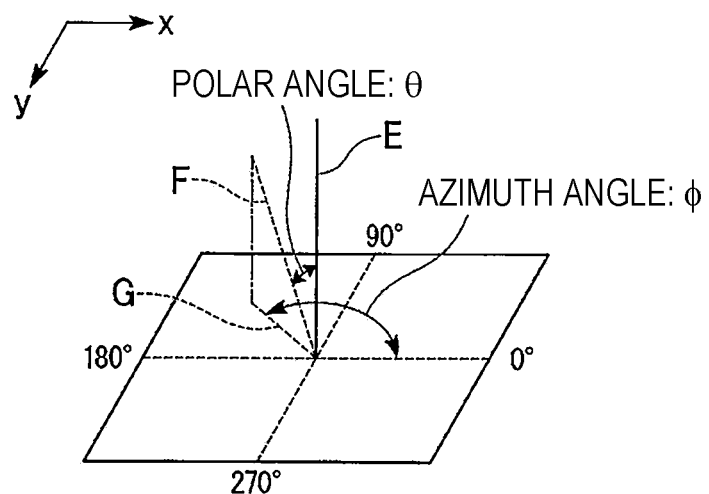
FIG. 8 is a diagram illustrating definitions of a polar angle and an azimuth angle.

FIG. 8 is a diagram illustrating definitions of a polar angle and an azimuth angle.

Here, as illustrated in FIG. 8, an angle formed by an observer's eye gaze direction F based on a direction E normal to a screen of the liquid crystal display device 1 is set to be a polar angle θ. An angle formed in a direction of a line segment G when the observer's eye gaze direction F based on a positive direction (direction of 0 degrees) of the x-axis is projected on the screen is set to be an azimuth angle φ.

Figure 9:
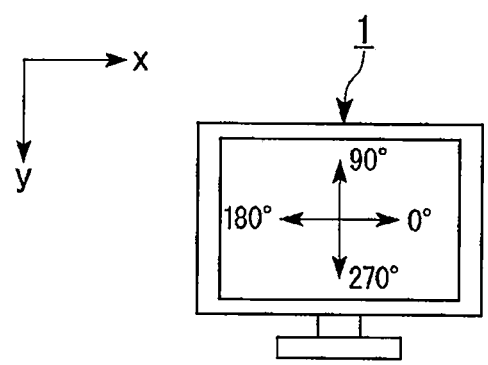
FIG. 9 is a front view of the liquid crystal display device.

FIG. 9 is a front view of the liquid crystal display device 1.

As illustrated in FIG. 9, in the screen of the liquid crystal display device 1, the horizontal direction (x-axis direction) is set to be a direction of an azimuth angle φ of 0 degrees to 180 degrees. In short, the direction of an azimuth angle φ of 0 degrees to 180 degrees is a right-left direction. Specifically, the direction of an azimuth angle φ of 0 degrees to 180 degrees is a direction along an axis parallel to the ground. The vertical direction (y-axis direction) is set to be a direction of an azimuth angle φ of 90 degrees to 270 degrees. In short, the direction of an azimuth angle φ of 90 degrees to 270 degrees is an up-down direction. Specifically, the direction of an azimuth angle φ of 90 degrees to 270 is a direction along an axis perpendicular to the ground.

Figure 10:
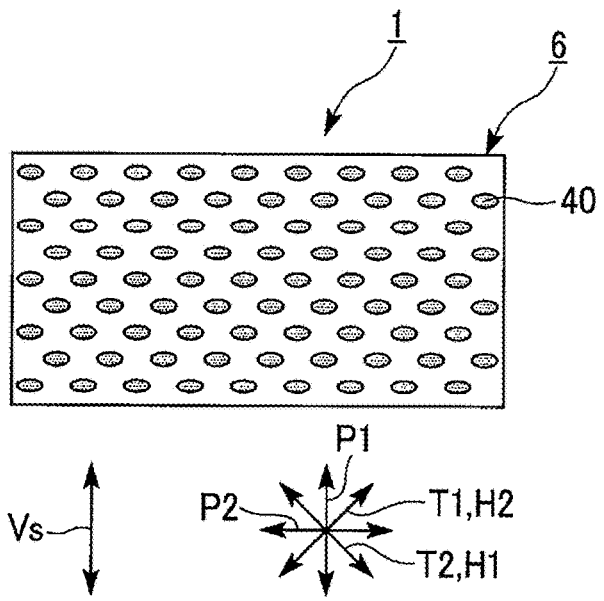
FIG. 10 is a diagram illustrating an arrangement relationship between an absorption axis of a polarizing film and a slow axis of a phase difference film in a front view of the liquid crystal display device.

FIG. 10 is a diagram illustrating an arrangement relationship between an azimuth angle direction Vs in which the diffusibility of the light diffusing film 7 (see FIG. 1) constituting the light diffusing member 6 is relatively high, a direction of the absorption axis of each polarizing film (the absorption axis direction P1 of the first polarizing film 3 and the absorption axis direction P2 of the second polarizing film 8), a slow axis direction of each phase difference film (slow axis direction T1 of the first phase difference film and the slow axis direction T2 of the second phase difference film), and the alignment control directions H1 and H2, in the front view of the liquid crystal display device 1 according to this embodiment. Meanwhile, in FIG. 10, the plurality of light shielding layers 40 are regularly arranged so as to have the same size for convenience of description.

As illustrated in FIG. 10, the front shape of the liquid crystal display device 1 of this embodiment is a rectangular shape which is elongated in the right-left direction (which is laterally elongated). In this embodiment, the azimuth angle direction Vs in which the diffusibility of the light diffusing film 7 is relatively high is a direction of an azimuth angle φ of 90 degrees to 270 degrees. Thereby, diffusion intensity in the up-down direction in the liquid crystal display device 1 is increased, and thus viewability in the up-down direction is further improved.

In this embodiment, the azimuth angle direction Vs in which the diffusibility of the light diffusing film 7 is relatively high and the short side of the light diffusing film 7 are made to be substantially parallel to each other. That is, in this embodiment, the azimuth angle direction Vs in which the diffusibility of the light diffusing film 7 is relatively high and the absorption axis P2 of the second polarizing film 8 are made to form an angle of approximately 90 degrees. In addition, the azimuth angle direction Vs in which the diffusibility of the light diffusing film 7 is relatively high and the absorption axis P1 of the first polarizing film 3 are made to be substantially parallel to each other.

Meanwhile, the azimuth angle direction Vs in which the diffusibility of the light diffusing film 7 is relatively high and the short side of the light diffusing film 7 do not need to be made to completely parallel to each other, and may be substantially parallel to each other. Generally, in an assembling process of a liquid crystal display device, it is considered that a deviation in a rotation direction of alignment between a liquid crystal panel and a polarizing plate is approximately 5 degrees or less. Therefore, the azimuth angle direction Vs in which the diffusibility of the light diffusing film 7 is relatively high and the short side of the liquid crystal panel may deviate from each other by approximately 5 degrees.

(Method of Manufacturing Liquid Crystal Display Device)

Hereinafter, a method of manufacturing the liquid crystal display device 1 of this embodiment will be described.

Figure 11:
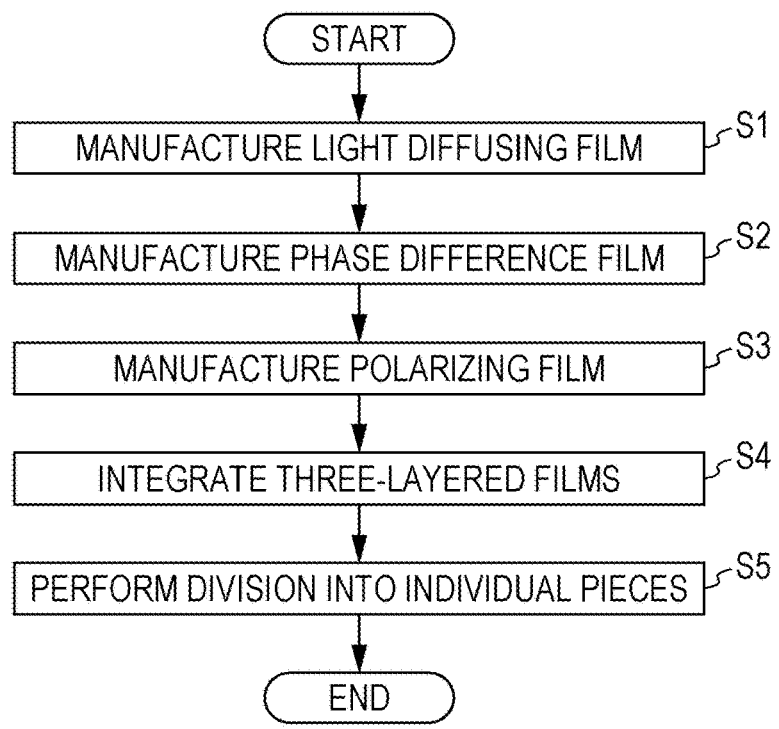
FIG. 11 is a flow chart illustrating a method of manufacturing a light diffusing member.
Figure 12A:
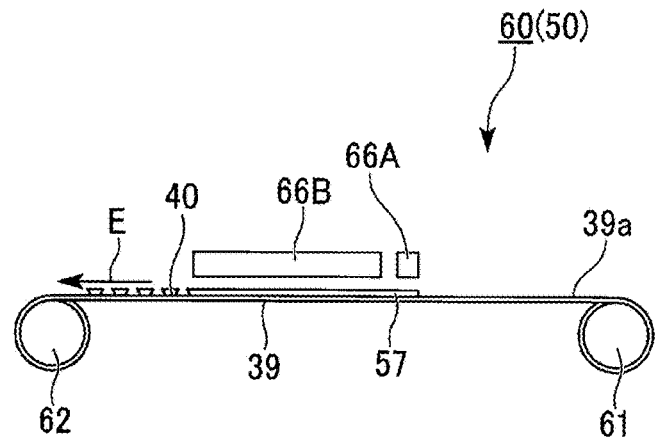
FIG. 12A is a first diagram illustrating a process of manufacturing a light diffusing film.
Figure 12B:
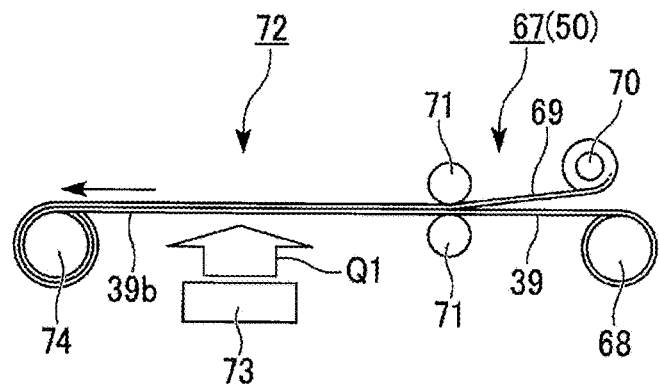
FIG. 12B is a second diagram illustrating a process of manufacturing a light diffusing film.
Figure 12C:
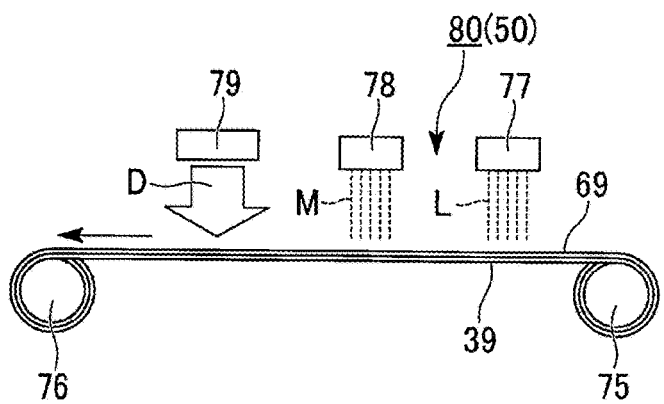
FIG. 12C is a third diagram illustrating a process of manufacturing a light diffusing film.
Figure 13:
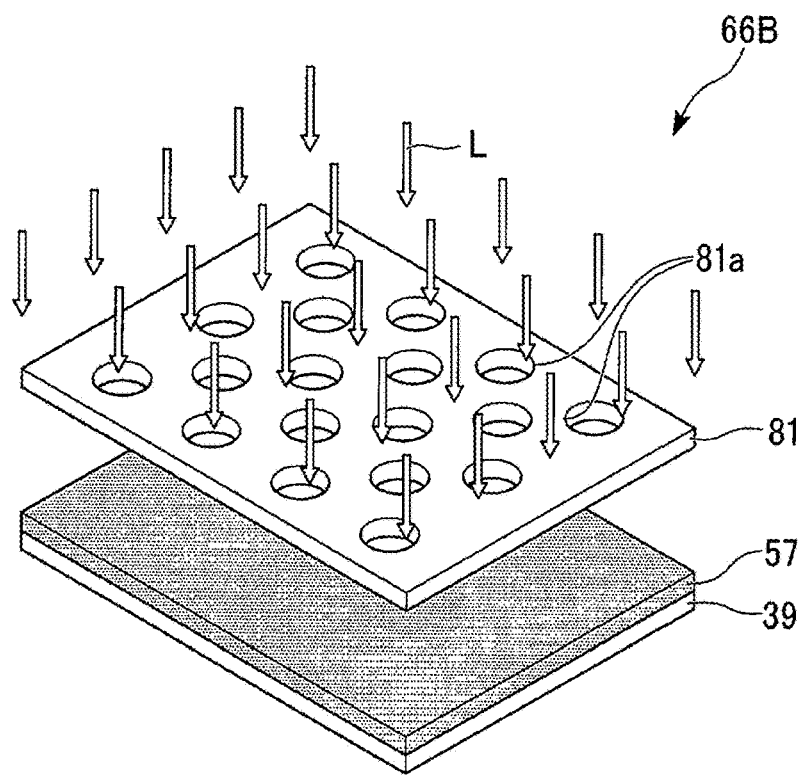
FIG. 13 is a perspective view illustrating a process of manufacturing a light shielding layer.
Figure 14:
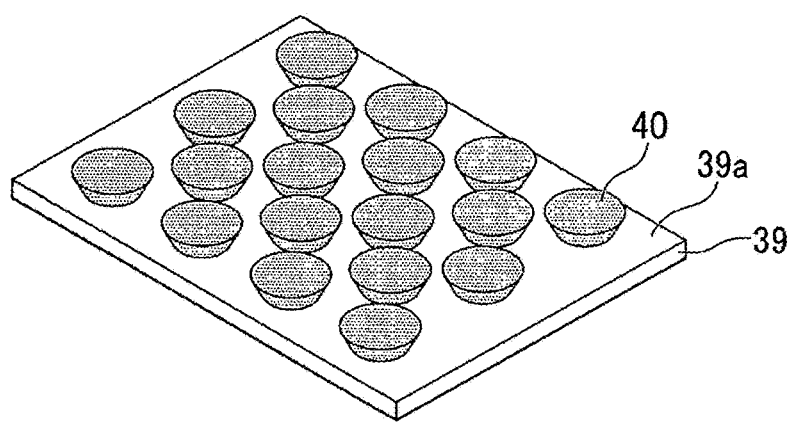
FIG. 14 is a perspective view illustrating a light shielding layer formed on a first substrate.
Figure 15:
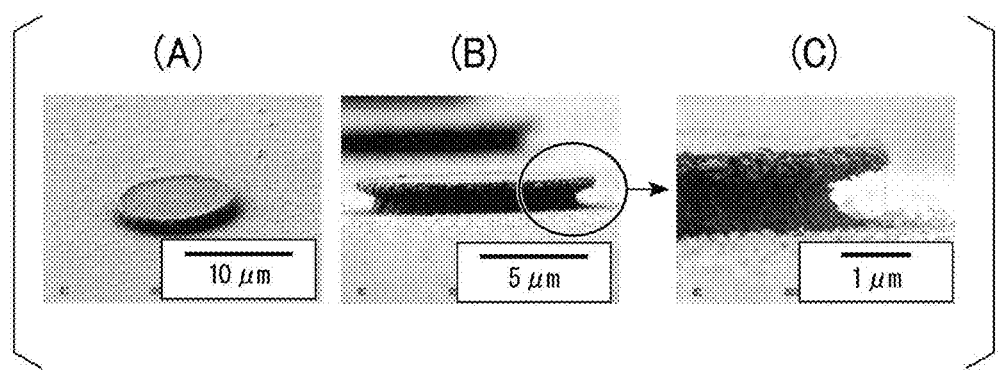
FIGS. 15(A) to 15(C) are diagrams illustrating a light shielding layer which is actually created.
Figure 16:
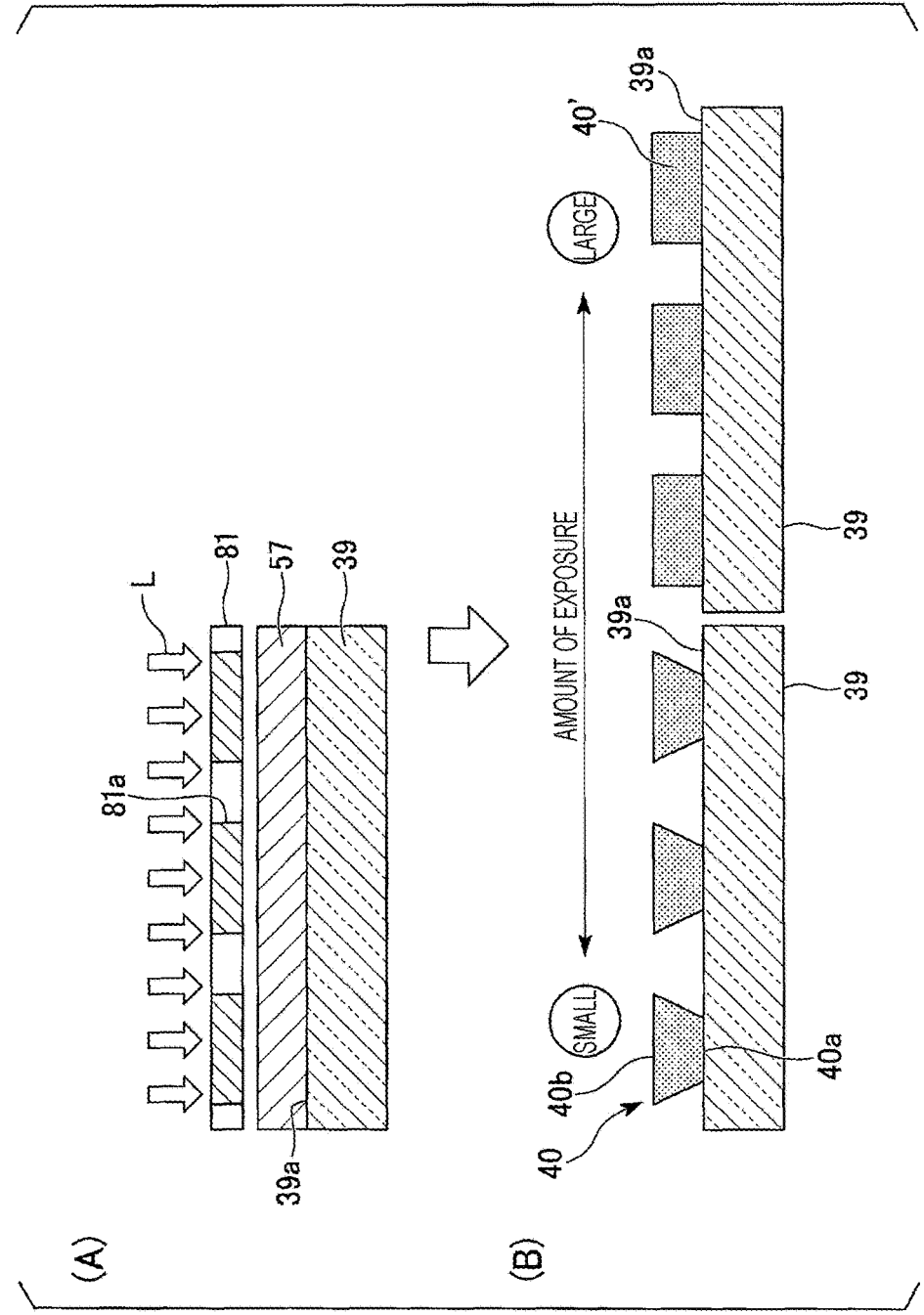
FIGS. 16(A) and 16(B) are diagrams illustrating a method of forming a light shielding layer.

FIG. 11 is a flow chart illustrating a method of manufacturing the light diffusing member 6. FIGS. 12A to 12C are diagrams illustrating a process of manufacturing the light diffusing film 7. FIG. 13 is a perspective view illustrating a process of manufacturing the light shielding layer 40. FIG. 14 is a perspective view illustrating the light shielding layer 40 formed on the first substrate 39.

The manufacturing method will be described focusing on the process of manufacturing the light diffusing member 6 constituting the liquid crystal display device 1 configured as described above.

An outline of a process of manufacturing the liquid crystal panel 5 will be described first. First, the TFT substrate 49 and the color filter substrate 10 are individually manufactured. Thereafter, the TFT substrate 49 and the color filter substrate 10 are disposed so that a surface of the TFT substrate on a side having the TFT 19 formed thereon and a surface of the color filter substrate on a side having the color filter 31 formed thereon face each other. The TFT substrate 49 and the color filter substrate 10 are bonded to each other through a sealing member. Thereafter, liquid crystal is injected into a space surrounded by the TFT substrate 49, the color filter substrate 10, and the sealing member. The manufacture of the liquid crystal panel 5 is completed through the above-mentioned processes.

A normal method may be used as a method of manufacturing the TFT substrate 49 and the color filter substrate 10, and a description thereof will be omitted here.

Next, a process of manufacturing the light diffusing member 6 will be described.

A manufacturing apparatus (apparatus for manufacturing a light control member) 50 used to manufacture the light diffusing member 6 includes at least a light shielding layer forming apparatus 60, a laminating apparatus 67, and a developing apparatus 80 illustrated in FIGS. 12A to 12C.

First, the light diffusing film 7 is manufactured (step S1 of FIG. 11).

When the light diffusing film 7 is manufactured, a pattern of the plurality of light shielding layers 40 is first formed in the first surface 39a of the first substrate 39 constituted by, for example, a TAC film. Here, an example in which the pattern of the light shielding layers 40 is formed by an offset printing method will be described. As a method of forming the pattern of the light shielding layers 40, not only the offset printing method but also a gravure printing method, a mask exposure method, an ink jet method, or the like can be used. As the material of the light shielding layer 40, for example, a black resin containing carbon, black ink, or the like is used.

As illustrated in FIG. 12A, the light shielding layer forming apparatus 60 transports the long first substrate 39 in a direction of an arrow E by roll-to-roll and performs printing in the meantime. In the light shielding layer forming apparatus 60, a sending roller 61 that sends the first substrate 39 is provided at one end, and a winding roller 62 that winds up the first substrate 39 is provided at the other end. The first substrate 39 moves toward the winding roller 62 side from the sending roller 61 side. A coating device 66A that coats the first surface 39a of the first substrate 39 with a black resist material, and an exposure and developing device (exposure device) 66B that performs exposure and developing on a black negative resist layer 57 constituted by a coating film are provided on the first surface 39a of the first substrate 39.

Since a roll-to-roll method is adopted in this example, a slit coater is used as the coating device 66A. However, a dry film resist may be laminated on the first substrate 39 by using a laminating device instead of the coating device 66A. In addition, in a case where the first substrate 39 which is cut out to a predetermined size is coated with a black resist material, a spin coater may be used. In this case, not only a transparent resin material but also glass can be used as the first substrate 39.

The exposure and developing device 66B performs exposure and developing from the upper portion of the black negative resist layer 57 by using a photomask 81 to thereby the plurality of light shielding layers 40 which are independent of each other. Specifically, as illustrated in FIG. 13, a polyethylene terephthalate (PET) film having a thickness of 100 μm is coated with a black negative resist mixed with carbon, thereby forming a coating film having a thickness of 2 μm. Pre-baking is performed on the coating film at 90° C., thereby forming the black negative resist layer 57 having a thin film shape. A plurality of holes 81a each having a diameter of 10 μm are formed in the photomask 81 with a pitch of 20 μm. The exposure and developing device 66B irradiates the black negative resist layer 57 with parallel light L through the photomask 81 to thereby perform exposure. In this embodiment, parallel exposure is performed using a ghi mixed line. In this manner, as illustrated in FIG. 14, a pattern of the plurality of light shielding layers 40 is formed on the first surface 39a of the first substrate 39.

FIGS. 15(A), 15(B), and 15(C) illustrate the light shielding layer 40 which is actually created by the inventors. Each of FIGS. 15(A) to 15(C) is an SEM photo captured by changing a magnification.

(Regarding Method of Forming Light Shielding Layer)

A method of forming a light shielding layer will be described in detail with reference to FIGS. 16(A) and 16(B).

As described above, the light shielding layer 40 of this embodiment has a sectional shape of a trapezoid shape in which the area of the mask side end surface (panel side end surface) 40b opposite the substrate side end surface 40a is larger than the area of the substrate side end surface 40a.

Accordingly, when diffused light is used as exposure light L in a case where exposure to the black negative resist layer (light shielding layer material film) 57 is performed through the photomask 81 from the first surface 39a side of the first substrate 39 as illustrated in FIG. 16(A), a region wider than a region specified by the holes 81a of the photomask 81 is irradiated with light. Then, in the black negative resist layer 57 after developing, the light shielding layer in which the area of the substrate side end surface is larger than the area of the mask side end surface.

Accordingly, in order to form the light shielding layer 40 of this embodiment, parallel light is suitable for the exposure light L as illustrated in FIG. 16(A). So-called underexposure for performing exposure with an amount which is sufficiently smaller than the standard amount of exposure to light with respect to the thickness of the black negative resist layer 57 is performed using the parallel light.

In addition, it is also necessary to adjust the amount of exposure to light in order to form the shape of the light shielding layer 40 as in this embodiment. As illustrated in FIG. 16(B), when the amount of exposure to light with respect to the black negative resist layer 57 is large, a light shielding layer 40′ having a columnar shape is formed. Accordingly, it is preferable to reduce the amount of exposure to light with respect to the black negative resist layer 57. Light absorptivity in the black negative resist layer 57 is high, and thus the amount of light transmitted in a film thickness direction is gradually reduced. Accordingly, the amount of light reaching a surface of the black negative resist layer 57 on the first substrate 39 side is reduced. By such a phenomenon, it is possible to form the light shielding layer 40 in which the area of the substrate side end surface 40a is smaller than the area of the mask side end surface 40b.

However, an excessively small amount of exposure to light may result in the peeling of the light shielding layer 40 from the first substrate 39 during developing, and thus a minimum amount of exposure to light is required which is enough to be able to secure such an adhesion as to prevent the light shielding layer 40 from being peeled off from the first substrate 39 during developing.

Subsequently, a negative type photosensitive resin layer is formed on the first surface 39a of the first substrate 39 in which a pattern of the plurality of light shielding layers 40 is formed. A method of forming a photosensitive resin layer includes a method such as laminating, slit coating, or printing of a dry film resist constituted by a photosensitive resin layer. Here, an example in which a photosensitive resin layer is formed by a laminating method is described.

In this embodiment, it is assumed that a photosensitive resin is not likely to be injected between the reversely tapered surface 40c of the light shielding layer 40 and the first surface 39a of the first substrate 39. Accordingly, it is considered that vacuum laminating is more effective than normal laminating.

As illustrated in FIG. 12B, the laminating apparatus 67 is provided with a first sending roller 68 that sends the first substrate 39 having the light shielding layer 40 formed therein, a second sending roller 70 that sends a dry film resist (negative type photosensitive resin layer) 69, a pair of hot rollers 71, and a winding roller 74. The first substrate 39 sent from the first sending roller 68 and the dry film resist 69 sent from the second sending roller 70 are bonded to each other by the pair of hot rollers 71.

An exposure device 72 is provided on a downstream side of the laminating apparatus 67. A light source 73 that emits diffused light Q1 is provided under the first substrate 39. Here, UV light having a predetermined diffusion angle is emitted toward the dry film resist 69 from a second surface 39b (lower surface) of the first substrate 39. At this time, since the light shielding layer 40 functions as a mask, a region other than a region having the light shielding layer 40 formed therein in the entire region of the dry film resist 69 is exposed.

As illustrated in FIG. 12C, the developing apparatus 80 transports the first substrate 39 with the dry film resist 69 exposed to light by roll-to-roll, and performs developing. In the developing apparatus 80, a sending roller 75 that sends the first substrate 39 is provided at one end, and a winding roller 76 that winds up the first substrate 39 is provided at the other end. The first substrate 39 moves toward the winding roller 76 side from the sending roller 75 side.

A developing solution supply device 77 that supplies a developing solution L is provided above the first substrate 39.

Further, a water cleaning device 78 that supplies pure water M and a drying device 79 that supplies dried air D for drying the first substrate 39 wet with the pure water M are sequentially provided on the downstream side of the developing solution supply device 77. The dry film resist 69 exposed to light is developed by an alkaline developing solution L, and a portion having a tapered transparent resin remaining therein serves as the light diffusing portion 41. The developed transparent resin is cleaned by the water cleaning device 78, and is dried by the drying device 79. Thereafter, post-curing or post-baking is performed using UV light to thereby reinforce the structure.

The light diffusing film 7 of this embodiment is manufactured through the above-mentioned processes.

Next, the second phase difference film 9 is manufactured (step S2 of FIG. 11).

When the second phase difference film 9 is manufactured, an alignment film is first formed on one surface of a substrate constituted by, for example, a TAC film. Thereafter, a discotic nematic phase is adopted on a light distribution film.

Next, the second polarizing film 8 is manufactured (step S3 of FIG. 11).

Although not shown in the drawing, the second polarizing film 8 is manufactured by extending a PVA film having, for example, an iodine compound immersed therein, performing a crosslinking process thereon, performing cleaning and drying thereon, and interposing the PVA film between two TAC films serving as substrates. Such a general method is used to manufacture a polarizing film.

Meanwhile, in FIG. 11, a description is given in order of processes of "manufacture of a light diffusing film", "manufacture of a phase difference film", and "manufacture of a polarizing film" as an example of a flow chart. However, these three types of films may be separately manufactured, and the order of manufacture does not particularly matter.

Next, the light diffusing film 7, the second phase difference film 9, and the second polarizing film 8, which are independently manufactured, are bonded to each other to be integrated, thereby manufacturing a preform for manufacturing a light diffusing member (step S4 of FIG. 11).

At this time, the second polarizing film 8 and the second phase difference film 9 are bonded to each other so that a slow axis of the second phase difference film 9 is at an azimuth between a transmission axis and an absorption axis of the second polarizing film 8.

Specifically, the slow axis of the second phase difference film 9 and the transmission axis of the second polarizing film 8 are bonded to each other so as to form an angle of approximately 45 degrees.

Subsequently, a bonding body of the second polarizing film 8 and the second phase difference film 9 and the light diffusing film 7 which is created in a separate process are bonded to each other. The bonding body constituted by three types of films bonded to each other is wound by a winding roller not shown in the drawing, thereby completing the manufacture of the preform for manufacturing a light diffusing member.

Next, the preform for manufacturing a light diffusing member is divided into individual pieces, thereby collectively manufacturing the plurality of light diffusing members 6 (step S5 of FIG. 11).

Finally, the completed light diffusing members 6 are bonded to the liquid crystal panel 5 using the adhesive layers 51 constituted by an optical adhesive in a state where the first substrate 39 side of the light diffusing film 7 faces a viewing side and the phase difference layer 56 side of the second phase difference film 9 faces the liquid crystal panel 5, as illustrated in FIG. 2. In addition, the first phase difference film 4 and the first polarizing film 3 are sequentially bonded to the back side (side facing the backlight 2) of the liquid crystal panel 5. Meanwhile, the first phase difference film 4 and the first polarizing film 3 may be bonded to each other before being bonded to the liquid crystal panel 5, similar to the light diffusing member 6.

The manufacture of the liquid crystal display device 1 according to this embodiment is completed through the above-mentioned processes.

Figure 17:
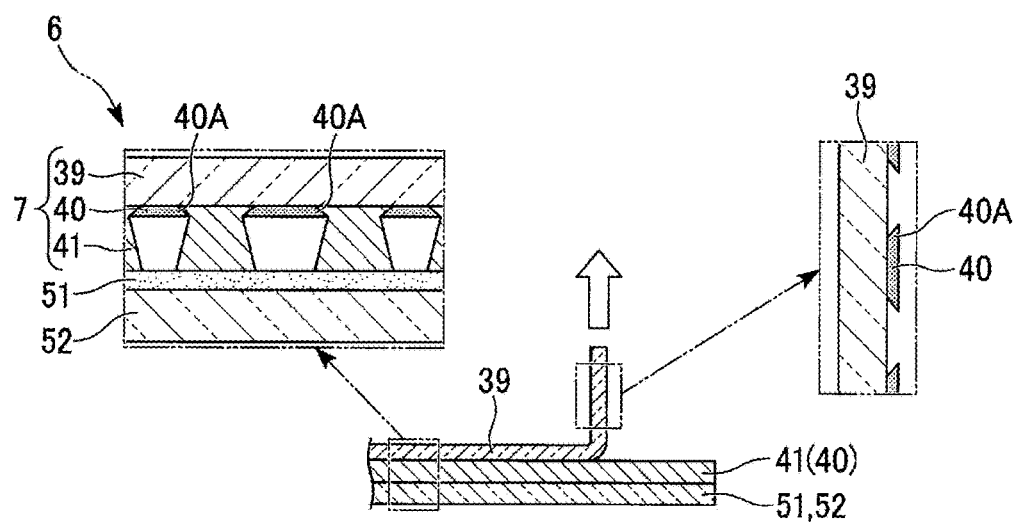
FIG. 17 is a diagram illustrating a state of a peeling test of a light diffusing film.
Figure 18:
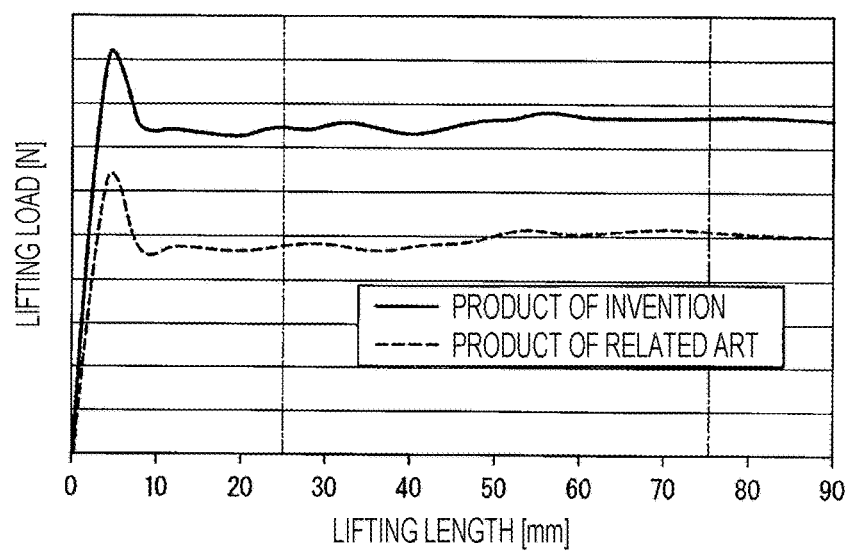
FIG. 18 is a graph showing results of the peeling test of the light diffusing film.

Next, the evaluation of strength of the light diffusing film 7 will be described. FIG. 17 is a diagram illustrating a state of a peeling test of the light diffusing film 7. FIG. 18 is a graph showing results of the peeling test.

Actually, a peeling test of the light diffusing film 7 is performed using the created light diffusing member 6, and adhesiveness between the first substrate 39 and the light diffusing portion 41 is evaluated. Here, a 90-degrees peeling test is performed.

As illustrated in FIG. 17, first, the light diffusing member 6 is positioned at a horizontal location with the first substrate 39 side facing upward. In this state, the first substrate 39 of the light diffusing film 7 is lifted in the normal direction (direction of 90 degrees from a substrate surface) of the light diffusing member 6. A lifting speed is preferably 30 mm/min. After measurement is started, measurement at a predetermined length (length of 25 mm) from an end is neglected.

Thereafter, measurement values of adhesion at a length of 50 mm of peeling-off are averaged to be set as a value of peeling-off adhesion.

A peeling test as in the light diffusing member 6 of this embodiment is performed on a light diffusing member having a configuration of the related art. Meanwhile, a sectional shape of the light shielding layer 40 of the light diffusing film 7 in this embodiment is a substantially trapezoid shape, while a sectional shape of a light shielding layer of a light diffusing film of the related art is a rectangular shape.

In FIG. 18, a graph of peeling test results of the light diffusing film 7 in this embodiment is indicated by a solid line, and a graph of peeling test results of a light diffusing film of the related art is indicated by a dashed line.

As shown in FIG. 18, it can be understood that the light diffusing film of this embodiment has higher adhesiveness between the first substrate 39 and the light diffusing portion 41 than that of the light diffusing film of the related art. Thereby, it can be said that an anchor function to be described later of the light shielding layer 40 having a reversely tapered shape with respect to the light diffusing portion 41 exhibits an effect.

According to these results, an anchor action of the light shielding layer 40 with respect to the light diffusing portion 41 is enhanced as a ratio between the substrate side end surface 40a of the light shielding layer 40 and the panel side end surface 40b opposite the substrate side end surface 40a becomes larger, and thus it is expected that adhesiveness between the first substrate 39 and the light diffusing portion 41 is improved. In addition, it is considered that adhesiveness between the first substrate 39 and the light diffusing portion 41 is improved as the thickness of the light shielding layer 40 with respect to the thickness of the light diffusing portion 41 becomes larger.

As described above, in this embodiment, a configuration is adopted in which a portion of the light diffusing portion 41 enters between a gap formed between the light shielding layer 40 and the first substrate 39 by the light shielding layer 40 being formed to have the above-mentioned reversely tapered shape. The adhesiveness of the light shielding layer 40 with respect to the first substrate 39 is higher than the adhesiveness of the light diffusing portion 41 with respect to the first substrate. Accordingly, a configuration is adopted in which the enlarged portion 40A of the light shielding layer 40 and the light diffusing portion 41 engage with each other in the normal direction of the first substrate 39, and thus it is possible to configure a structure resisting against a force (for example, a tensile force in the normal direction of the first substrate 39) which is stronger than adhesiveness acting between the light diffusing portion 41 and the first substrate 39.

A function of resisting against a force (for example, a tensile force in the normal direction of the first substrate 39) which is stronger than adhesiveness acting between the light diffusing portion 41 and the first substrate 39 is referred to as an anchor function in the following description.

Next, optical characteristics of the light diffusing film 7 will be described with reference to FIGS. 19A and 19B. Meanwhile, FIG. 19A is a diagram illustrating optical characteristics of a light diffusing film of the related art, and FIG. 19B is a diagram illustrating optical characteristics of the light diffusing film of this embodiment.

Figure 19A:
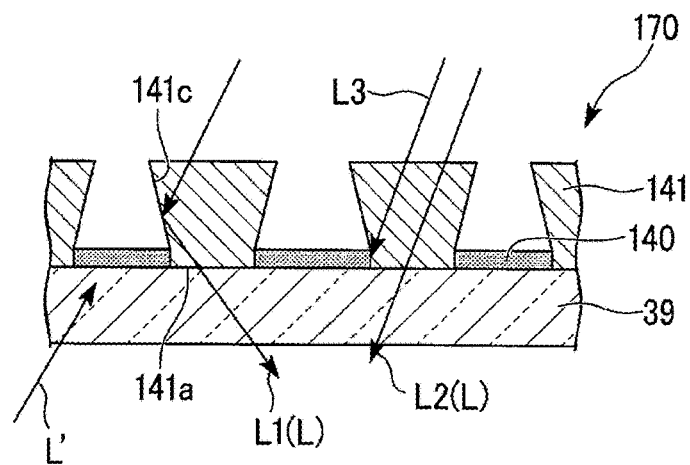
FIG. 19A is a diagram illustrating optical characteristics of a light diffusing film of the related art.

As illustrated in FIG. 19A, in a light diffusing film 170 of the related art, light L emitted from a light diffusing portion 141 is divided into light L1 which is reflected by a reflective surface 141c and is emitted from a light emitting end surface 141a, and light L2 which advances straight as it is and passes through the light diffusing portion 141 without being reflected from the reflective surface 141c. Meanwhile, the entire light incident on the light diffusing portion 141 is not emitted from the light emitting end surface 141a side, and a portion of light L3 is absorbed into the light shielding layer 140.

Figure 19B:
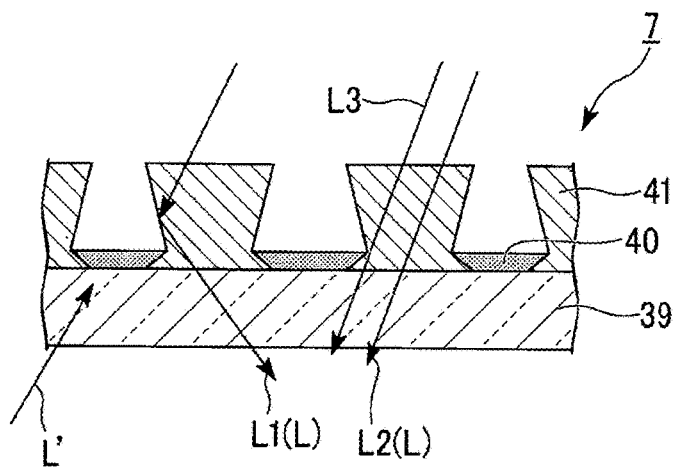
FIG. 19B is a diagram illustrating optical characteristics of a light diffusing film of the embodiment.

On the other hand, in the light diffusing film 7 of this embodiment, light emitted from the light diffusing portion 41 is divided into light L1 which is reflected by the reflective surface 41c and is emitted from the light emitting end surface 41a, and light L2 which advances as it is and passes through the light diffusing portion 41 without being reflected from the reflective surface 41c, as illustrated in FIG. 19B.

Compared with a configuration of the related art, in the configuration of this embodiment, areas of the reflective surface 41c of this embodiment which reflects light and the reflective surface 141c of the related art (area of an interface between the light diffusing portion 41 and air) are not changed, and thus the amount of reflected light is substantially the same as that in a case of a configuration of the related art. On the other hand, in the light diffusing film 7 of this embodiment, the above-mentioned light L3 which passes through the light diffusing portion 141 and is then absorbed into the side surface of the light shielding layer 140 is emitted. Accordingly, the amount of transmitted light is increased as compared with a configuration of the related art, and light utilization efficiency is improved.

In addition, scattered light of external light L' which causes a decrease in contrast can be prevented by being absorbed into the light shielding layer 40, similar to a configuration of the related art.

According to this embodiment, it is also possible to obtain effects of improving adhesiveness between the light diffusing portion 41 and the first substrate 39 by the shape of the light shielding layer 40 and improving light utilization efficiency without deteriorating display characteristics.

Figure 20A:
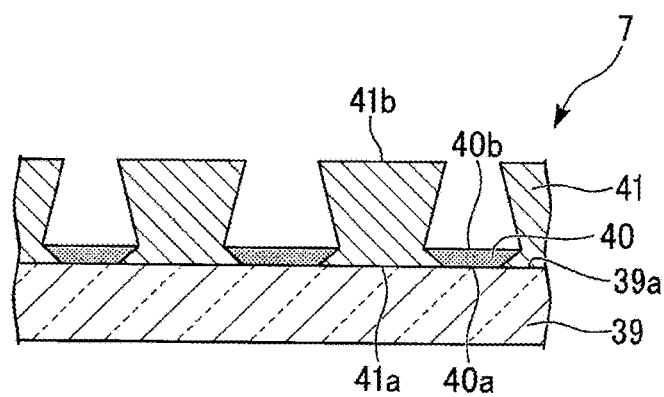
FIG. 20A is a sectional view illustrating a configuration of the light diffusing film of the embodiment.
Figure 20B:
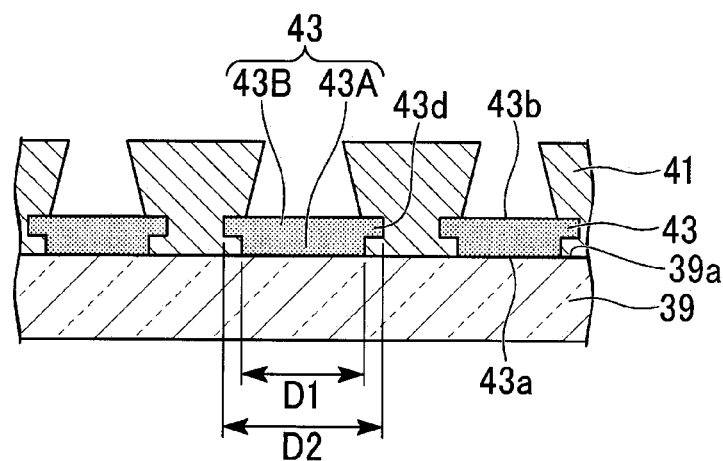
FIG. 20B is a sectional view illustrating a first modification example of the light diffusing film.
Figure 20C:
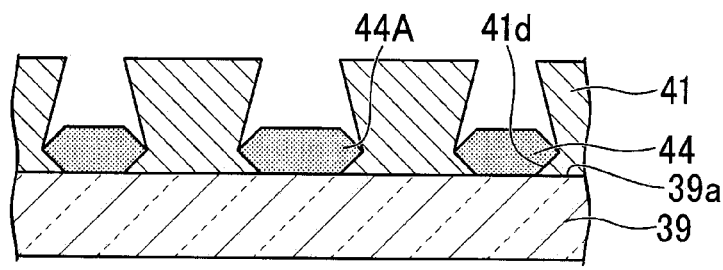
FIG. 20C is a sectional view illustrating a second modification example of the light diffusing film.
Figure 20D:
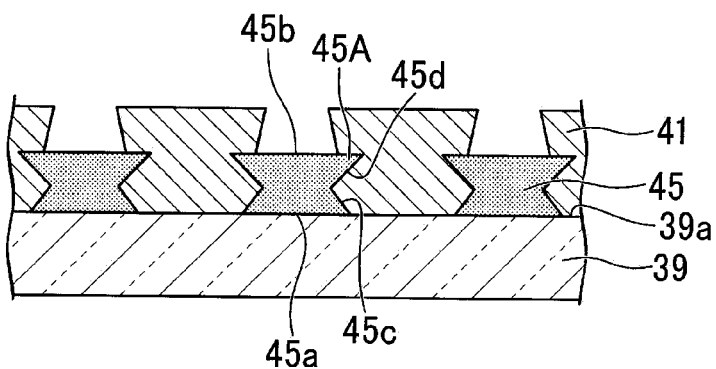
FIG. 20D is a sectional view illustrating a third modification example of the light diffusing film.

FIG. 20A is a sectional view illustrating a configuration of the light diffusing film 7 of this embodiment, and FIGS. 20B to 20D are sectional views illustrating a modification example of the light diffusing film 7.

As illustrated in FIG. 20A, the light shielding layer 40 of the light diffusing film 7 in this embodiment has a reversely tapered shape in which the area of the panel side end surface 40b opposite the substrate side end surface 40a is larger than the area of the substrate side end surface being in contact with the first surface 39a of the first substrate 39.

A light shielding layer 43 illustrated in FIG. 20B includes a cylindrical portion 43A having a diameter D1 and a cylindrical portion 43B having a diameter D2 larger than the diameter D1, and has a shape in which the area of the panel side end surface 43b is larger than the area of the substrate side end surface 43a. The light shielding layer has a structure in which an enlarged portion 43d which is a peripheral edge portion of the cylindrical portion 43B is buried in the light diffusing portion 41.

A light shielding layer 44 illustrated in FIG. 20C has a center-bulged shape in which a sectional area which is cut by a plane parallel to the first surface 39a of the first substrate 39 is largest in a central portion in a layer thickness direction. A portion of an enlarged portion 44A of the central portion in the layer thickness direction is in contact with the inclined surface 41d of the light diffusing portion 41.

A light shielding layer 45 illustrated in FIG. 20D has a center-narrow shape in which a sectional area which is cut by a plane parallel to the first surface 39a of the first substrate 39 is smallest in the central portion in the layer thickness direction. The light shielding layer 45 is configured such that the area of a panel side end surface 45b is larger than the area of a substrate side end surface 45a. Alternatively, the area of the substrate side end surface 45a and the area of the panel side end surface 45b are substantially the same as each other. The side surface of the light shielding layer 45 is constituted by a forward tapered surface 45c expanding toward the substrate side end surface 45a side and a reversely tapered surface 45d expanding toward the panel side end surface 45b. The light shielding layer 45 has a structure in which an enlarged portion 45A formed by the reversely tapered surface 45d and the panel side end surface 45b is buried in the light diffusing portion 41.

In this manner, a shape replacing the light shielding layer 40 mentioned above may be a shape in which a sectional area which is cut by a plane parallel to the first surface 39a of the first substrate 39 in the layer thickness direction has a portion (enlarged portion) larger than the area of the substrate side end surface 40a.

In addition, in a case where the sectional area of the substrate side end surface 40a is made constant, adhesiveness with respect to the light diffusing portion 41 is improved as the sectional area which is cut by a plane parallel to the first surface 39a of the first substrate 39 in the layer thickness direction of the light shielding layer 40 becomes larger, and thus an anchor effect is enhanced. Here, a minimum requirement is that the light shielding layers 40 do not come into contact with each other so as to allow the transmission of light.

In addition, as the layer thickness of the light shielding layer 40 becomes larger, an anchor effect to the light diffusing portion 41 is improved. However, on the other hand, an aspect ratio is increased, and thus there is the possibility that the adhesion of the light shielding layer 40 itself to the first substrate 39 is decreased. In addition, when the layer thickness of the light shielding layer becomes larger than the layer thickness of the light diffusing portion 41, there is a concern that the light diffusing portion 41 does not optically come into contact with the adhesive layer 51 when the light diffusing film 7 is bonded to the second polarizing film 8 by using the adhesive layer 51, in losing an interface between a resist totally reflecting light and air. Accordingly, it is preferable that the light shielding layer 40 is formed to have a thickness smaller than the layer thickness of the light diffusing portion 41 and is formed to have such a thickness that the light shielding layer has a sufficient UV light shielding property.

An area ratio between the substrate side end surface 40a and the panel side end surface 40b of the light shielding layer 40 and the layer thicknesses of the end surfaces can be confirmed by observation using an SEM.

[Method of Manufacturing Light Diffusing Member in Second Example]

Next, a method of manufacturing a light diffusing member in a second example will be described focusing on a process of forming a light shielding layer. This example is different from the previous example in that diffused light is used as exposure light during the process of forming a light shielding layer.

Figure 21A:
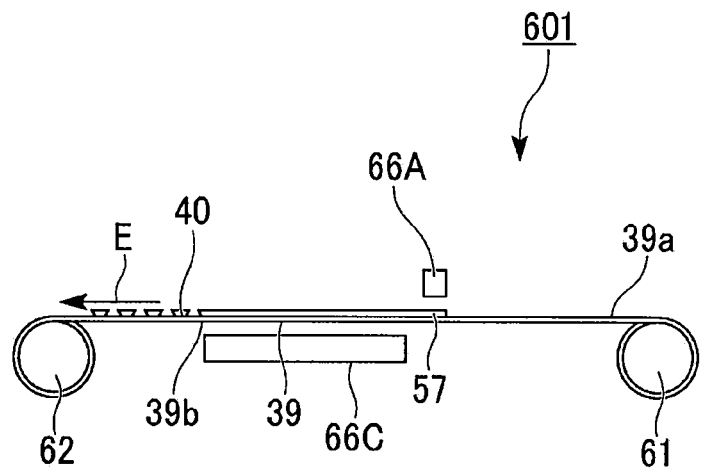
FIG. 21A is a diagram illustrating a schematic configuration of a light shielding layer forming apparatus for manufacturing a light shielding layer of a light diffusing film in a second example.
Figure 21B:
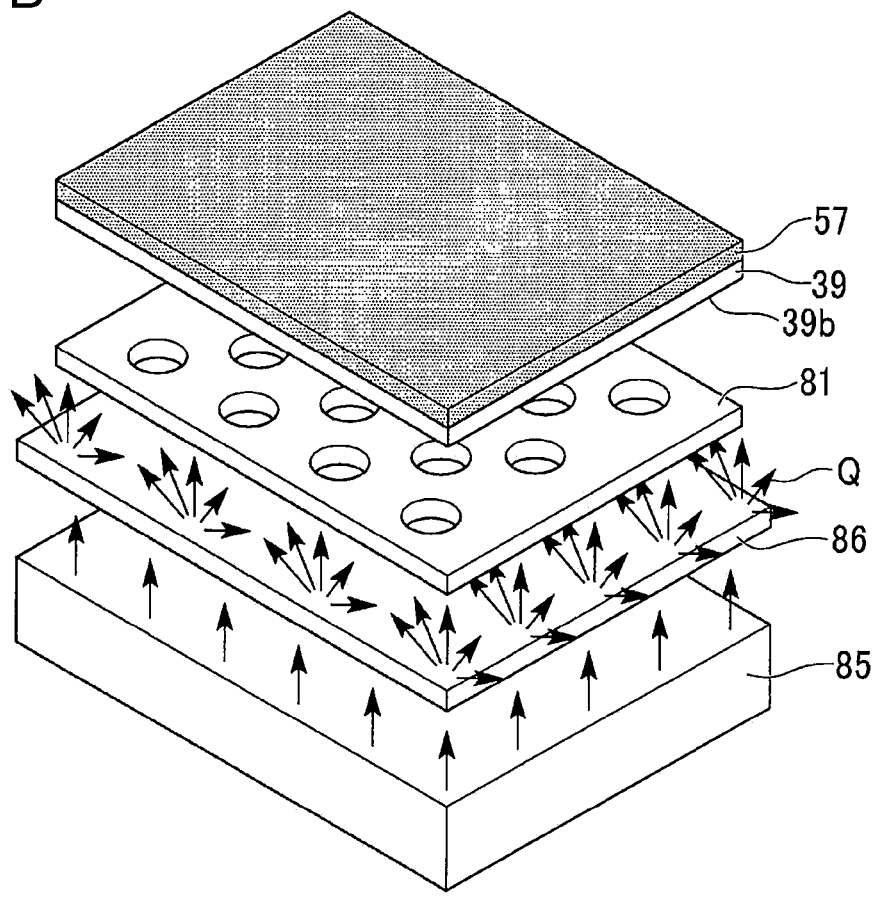
FIG. 21B is a perspective view illustrating a process of forming the light shielding layer in the second example.
Figure 22:
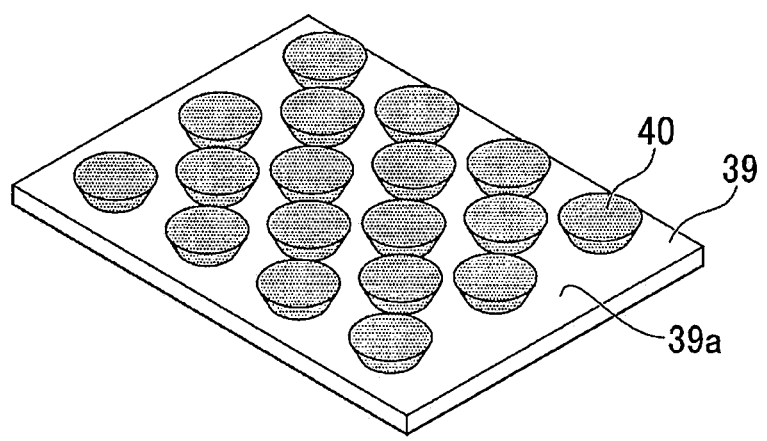
FIG. 22 is a perspective view illustrating the light shielding layer formed in the second example.

FIG. 21A is a diagram illustrating a schematic configuration of a light shielding layer forming apparatus for manufacturing a light shielding layer of a light diffusing film in the second example, and FIG. 21B is a perspective view illustrating a process of forming the light shielding layer in the second example. FIG. 22 is a perspective view illustrating the light shielding layer formed in the second example.

As illustrated in FIGS. 21A and 21B, in this example, exposure and developing are performed from below the first substrate 39 having the black negative resist layer 57 formed thereon by using a photomask 81, thereby forming a plurality of independent light shielding layers 40. Specifically, as illustrated in FIG. 21A, a black negative resist mixed with carbon is applied onto a polyethylene terephthalate (PET) film having a thickness of 100 μm which serves as the first substrate 39 by a light shielding layer forming apparatus 601, thereby forming a coating film (black negative resist layer 57) having a thickness of 2 μm. Prebaking is performed on the coating film at a temperature of 90° C., thereby forming the black negative resist layer 57 having a thin film shape as illustrated in FIG. 21B.

As illustrated in FIGS. 21A and 21B, an exposure and developing device 66C includes the photomask 81 disposed under the first substrate 39, an exposure device 85 that irradiates the first substrate 39 having the black negative resist layer 57 formed thereon with light through the photomask 81, and a light diffusing film 86 disposed between the photomask 81 and the exposure device 85. Light emitted from the exposure device 85 is diffused in the light diffusing film 86, and the black negative resist layer 57 is irradiated with diffused light Q as exposure light.

Exposure is performed by irradiating the black negative resist layer 57 with the diffused light Q through the photomask 81 from the second surface 39b side of the first substrate 39. In this example, irradiation is performed with UV light as diffused light Q. In this manner, as illustrated in FIG. 22, a pattern of the plurality of light shielding layers 40 is formed on the first surface 39a of the first substrate 39.

In this example, as illustrated in FIG. 23(A), exposure is performed from the second surface 39b side of the first substrate 39, and thus diffused light Q capable of being emitted in a wider range is appropriately used. In a case where back exposure is performed using the photomask 81, the light shielding layer 40 having a shape in which the area of the panel side end surface 40b opposite the substrate side end surface 40a is larger than the area of the substrate side end surface 40a as a diffusion range of exposure light becomes wider as illustrated in FIG. 23(B) is formed. In addition, the light shielding layer 40 having a shape in which the area of the panel side end surface 40b opposite the substrate side end surface 40a is larger than the area of the substrate side end surface as the amount of exposure to light becomes larger is formed.

In this method, it is necessary to make the area of an end surface on a side opposite the photomask 81 larger than the area of an end surface on the photomask 81 side, and thus an exposure light diffusing width is increased, and the amount of exposure to light is increased. However, when the amount of exposure to light is excessively large, a portion to be developed is also not dissolved in a developing solution. Accordingly, the amount of exposure to light is adjusted so as not to be excessively large.

[Method of Manufacturing Light Diffusing Member in Third Example]

Next, a method of manufacturing a light diffusing member in a third example will be described focusing on a process of forming a light shielding layer. In this example, two-stage exposure is performed during a process of forming a light shielding layer.

Figure 24A:
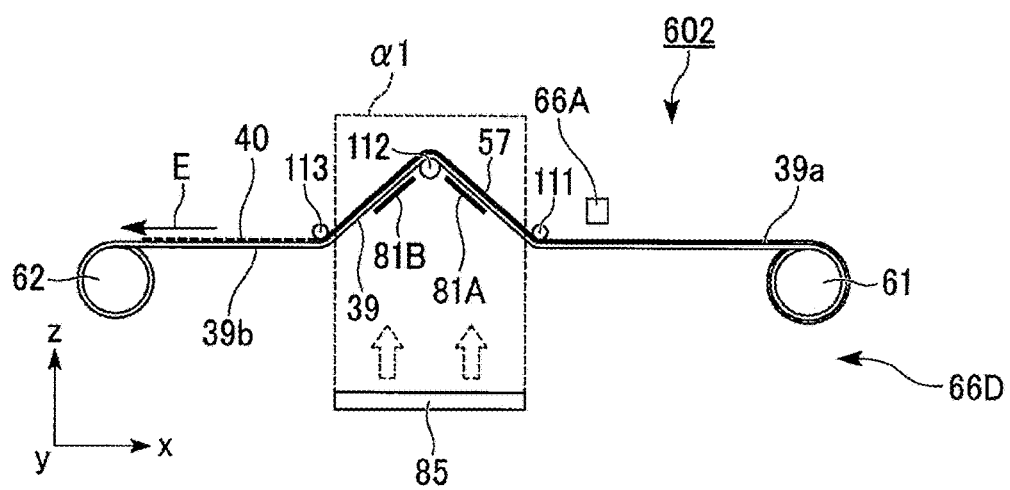
FIG. 24A is a diagram illustrating a schematic configuration of a light shielding layer forming apparatus which is used to manufacture a light shielding layer in a third example.
Figure 24B:
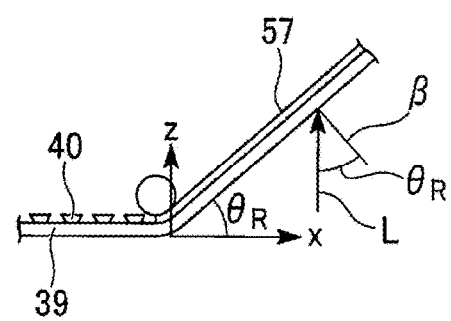
FIG. 24B is a first diagram illustrating a process of forming the light shielding layer in the third example.
Figure 24C:
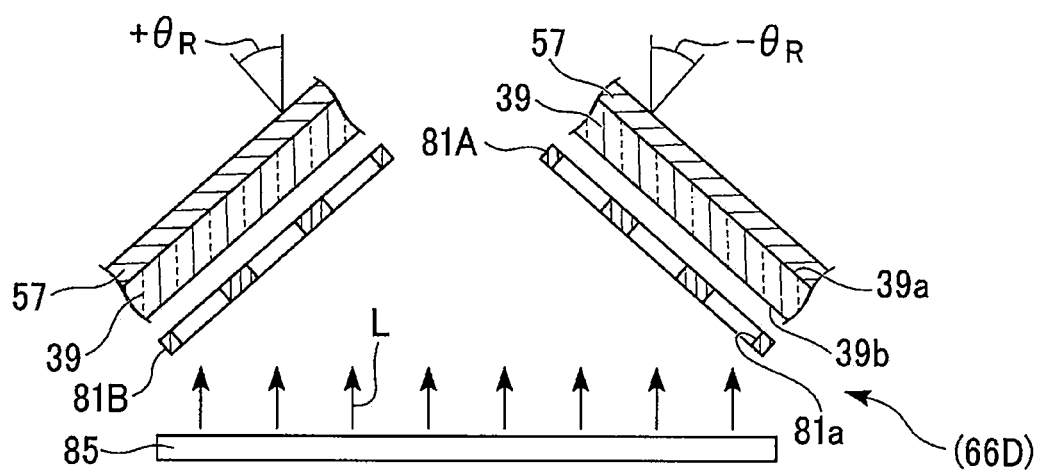
FIG. 24C is a second diagram illustrating a process of forming the light shielding layer in the third example.
Figure 24D:
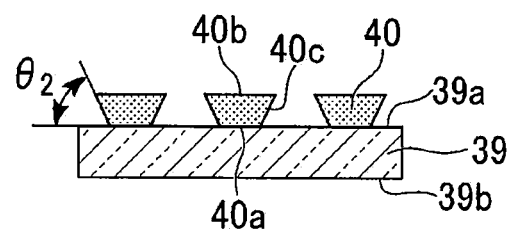
FIG. 24D is a third diagram illustrating a process of forming the light shielding layer in the third example.

FIG. 24A is a diagram illustrating a schematic configuration of a light shielding layer forming apparatus which is used to manufacture a light shielding layer in the third example. FIGS. 24B to 24D are diagrams illustrating a process of forming a light shielding layer in the third example.

In this embodiment, for example, an apparatus as illustrated in FIG. 24A is used as a light shielding layer forming apparatus 602. In FIG. 24A, a direction in which the first substrate 39 is transported (direction indicated by an arrow E in the drawing) is set to be an X-direction, the width direction of the first substrate 39 is set to be a Y-direction, and the height direction of the exposure device 85 is set to be a Z-direction.

The light shielding layer forming apparatus 602 includes an exposure and developing device 66D including a pair of photomasks 81A and 81B, the exposure device 85 which is located below the photomasks 81A and 81B, and a first roller 111, a second roller 112, and a third roller 113 that support the first substrate 39 in order along the transport direction thereof. The photomask 81A is disposed on the second surface 39b side of the first substrate 39 which is located between the first roller 111 and the second roller 112, and the photomask 81B is disposed on the second surface 39b side of the first substrate 39 which is located between the second roller 112 and the third roller 113.

The second roller (inclination mechanism) 112 is disposed above the first roller 111 and the third roller 113 in the Z-direction. The first substrate 39 is bent and passes at the time of being transported to the third roller 113 through the second roller 112 from the first roller 111. In other words, the first substrate 39 having the black negative resist layer 57 formed thereon is transported to the exposure device 85 in an inclined state.

More specifically, as illustrated in FIG. 24B, an arbitrary inclination angle $\theta_R$ can be formed in the X-direction with respect to the first substrate 39 transported in the X-direction. Meanwhile, in FIG. 24B, the normal line of the first substrate 39 is indicated by a sign β.

In this state, parallel light L emitted from the exposure device 85 is incident at an inclination angle $\pm\theta_R$ which is inclined with respect to the normal direction of the first substrate 39, as illustrated in FIG. 24C. Meanwhile, in a case where, for example, an inclination angle (incidence angle) on the third roller 113 side is set to be $+\theta_R$ focusing on the second roller 112, an inclination angle (incidence angle) on the first roller 111 side is set to be $-\theta_R$. The second roller 112 movable in the Z-axis direction within an exposure region α1 is disposed in the central portion of the exposure region α1, and thus it is possible to equalize the amount of irradiation with the parallel light L at the inclination angle $+\theta_R$ on the third roller 113 side and the inclination angle $-\theta_R$ on the second roller 112 side.

The exposure and developing device 66D performs a first exposure process on a predetermined region of the black negative resist layer 57 on the first substrate 39 by using the exposure device 85 when transporting the first substrate 39 between the first roller 111 and the second roller 112.

Thereafter, when the first substrate 39 is transported between the second roller 112 and the third roller 113, a second exposure process is performed on the predetermined region of the black negative resist layer 57 on the first substrate 39 by using the exposure device 85.

In this manner, as illustrated in FIG. 24D, the plurality of light shielding layers 40 are formed on the first surface 39a of the first substrate 39.

The inclination angle $\theta_R$ of the first substrate 39 is set in accordance with a taper angle $\theta_2$ of the light shielding layer 40 to be formed. In other words, it is possible to adjust the taper angle $\theta_2$ of the light shielding layer 40 by the inclination angle $\theta_R$ of the first substrate 39 during the exposure process.

Figure 25:
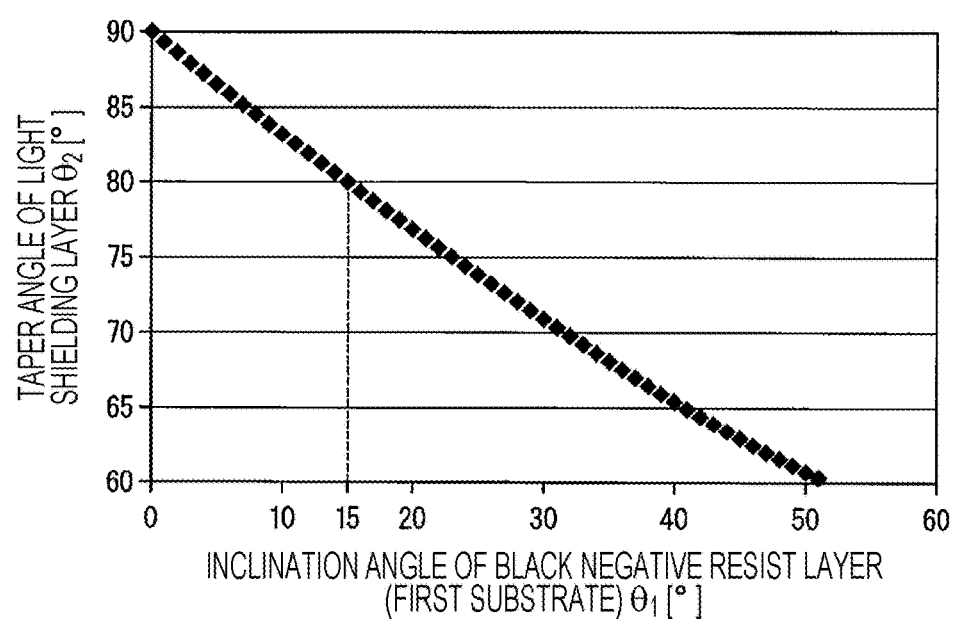
FIG. 25 is a diagram illustrating a relationship between an inclination angle of a black negative resist layer (first substrate) and a taper angle of a light shielding layer during exposure.

Here, for example, when a refractive index n with respect to ultraviolet rays (wavelength of 365 mm) of the first substrate 39 and the black negative resist layer 57 is set to 1.5, a relationship between the inclination angle $\theta_R$ of the black negative resist layer 57 (first substrate 39) during exposure and the taper angle $\theta_2$ of the light shielding layer 40 to be formed is as shown in a graph of FIG. 25. In FIG. 25, the horizontal axis represents an inclination angle $\theta_1$ (degrees) of the black negative resist layer 57 (first substrate 39), and the vertical axis represents the taper angle $\theta_2$ (degrees) of the light shielding layer 40.

As shown in FIG. 25, in a case where it is necessary to set the taper angle $\theta_2$ of the light shielding layer 40 to 80 degrees, the inclination angle $\theta_R$ of the black negative resist layer 57 is set to 15 degrees, and two-stage exposure is performed on the black negative resist layer 57 on the first substrate 39 which is inclined and transported.

In this manner, even when irradiation with the parallel light L is performed from the second surface 39b side (side opposite a surface on which the light shielding layer 40 and the black negative resist layer 57 are formed in the first substrate 39) in a state where an inclination is given to the first substrate 39 with respect to the X-direction, that is, in a state where an inclination angle is given thereto in the normal direction, it is possible to form the light shielding layer 40 having a tapered shape on the first substrate 39.

(Modification Example of Light Diffusing Film)

Figure 26A:
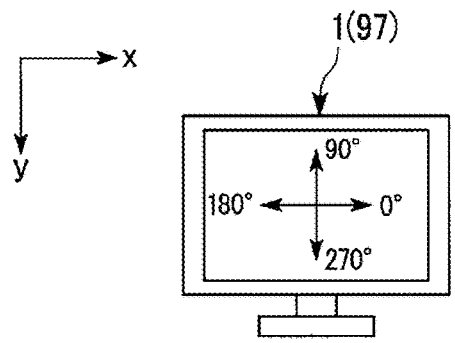
FIG. 26A is a front view of a liquid crystal display device.
Figure 26B:
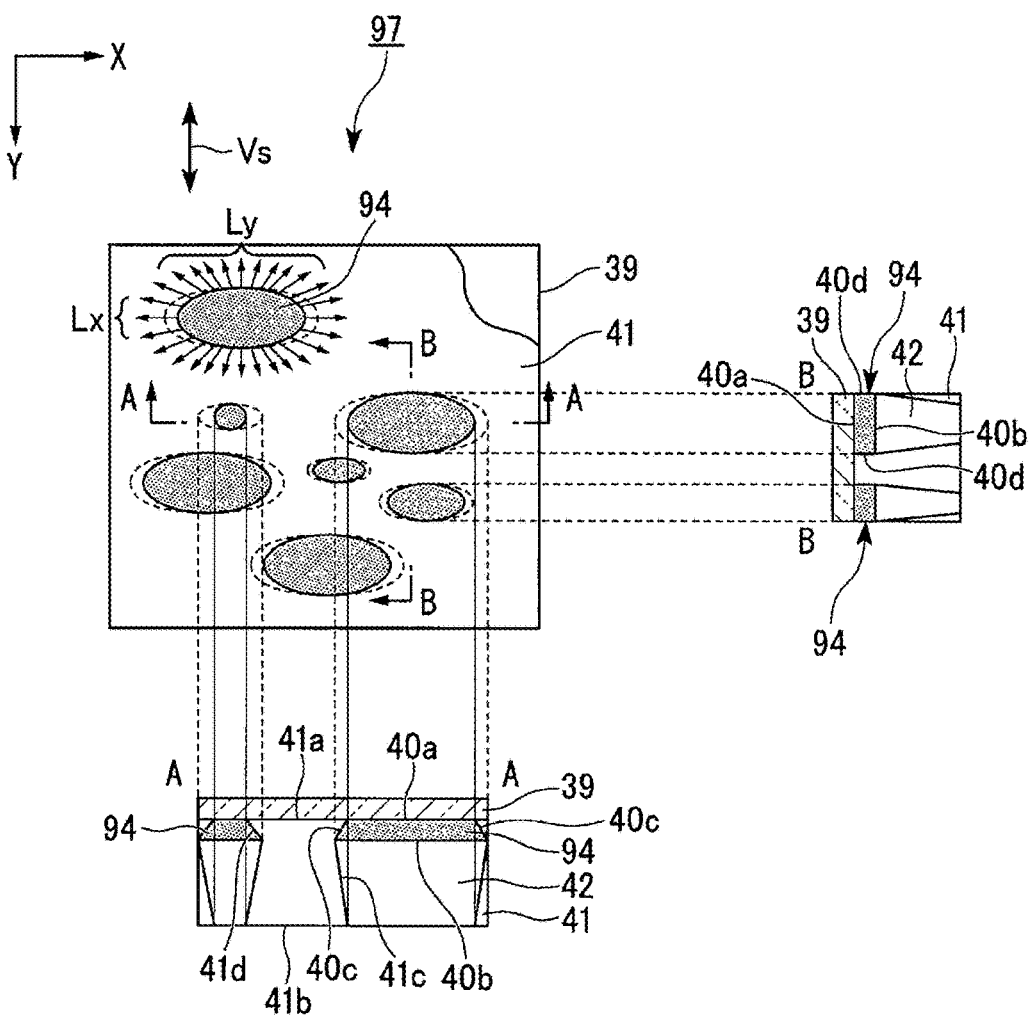
FIG. 26B illustrates a plan view of a light diffusing film and sectional views thereof when seen in two directions.

FIG. 26A is a front view of a liquid crystal display device, and FIG. 26B includes a plan view of a light diffusing film according to a modification example and sectional views thereof when seen in two directions.

As in the liquid crystal display device 1 illustrated in FIG. 26A, the peeling resistance of a light diffusing film 97 in a right-left direction (direction of 0 degrees to 180 degrees) when bonding the light diffusing film 97 to the liquid crystal display device is considered. In The liquid crystal display device 1 is configured to have a length in the right-left direction rather than in the up-down direction, and thus there is a tendency for bending to occur in the right-left direction.

Consequently, as illustrated in FIG. 26B, an anchor function with respect to the light diffusing portion 41 is obtained by inclining the side surface of the light shielding layer 94 along at least the right-left direction (direction of 0 degrees to 180 degrees), and thus peeling resistance in the horizontal direction is improved. Accordingly, it is preferable that the reversely tapered surface 40c of the light shielding layer 40 is provided in the right-left direction (direction of 0 degrees to 180 degrees) of the liquid crystal display device 1.

[Light Diffusing Film According to Second Embodiment]

Next, a light diffusing film according to a second embodiment will be described.

Figure 27:
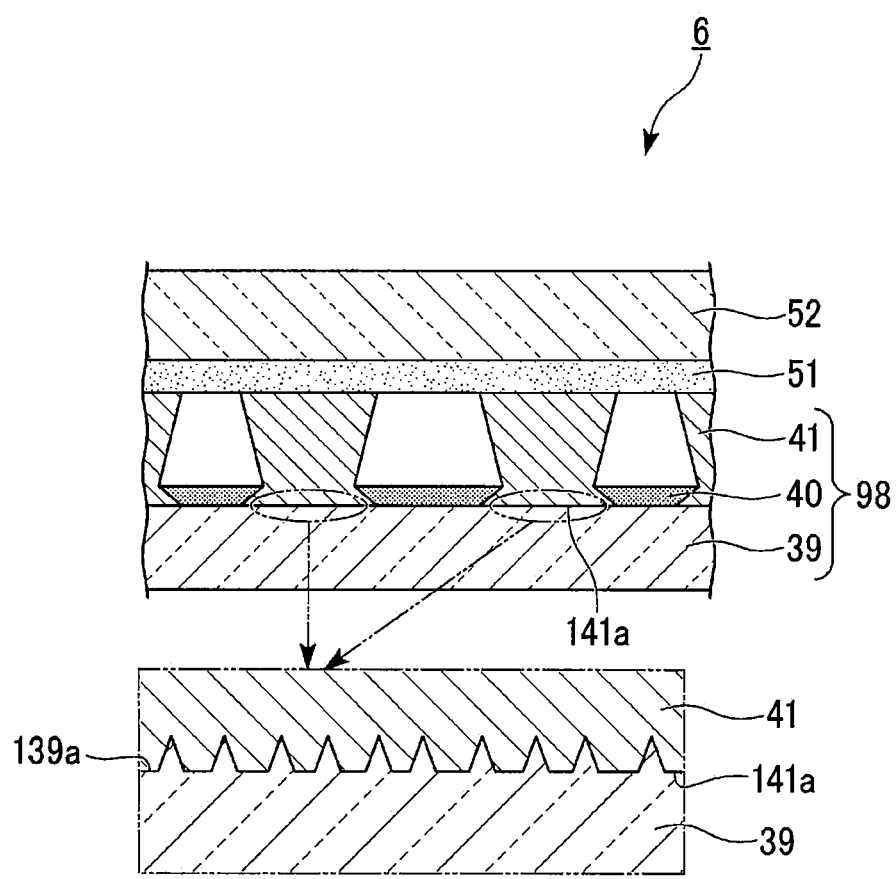
FIG. 27 is a diagram illustrating a main configuration of a light diffusing film according to a second embodiment.

FIG. 27 is a diagram illustrating a main configuration of the light diffusing film according to the second embodiment. Meanwhile, in FIG. 27, a region surrounded by a two-dot chain line is partially enlarged.

As illustrated in FIG. 27, a light diffusing film 98 of this embodiment is configured such that irregularities are formed in contact surfaces between a first substrate 39 and a light diffusing portion 41. Specifically, each of a light emitting end surface (contact surface) 141a of the light diffusing portion 41 and a first surface 139a of the first substrate 39 is formed as an uneven surface.

In this manner, the first surface 139a of the first substrate 39 and the light emitting end surface 141a of the light diffusing portion 41 are given irregularities to be roughened, which results in an increase in a contact area between the light diffusing portion 41 and the first substrate 39, and thus it is possible to further improve adhesion therebetween.

As a roughening technique, surface treatment using plasma, imprinting, an etching process using a strong oxidant, such as chromic acid or permanganate, or the like can be adopted. It is desirable that a surface roughness (an arithmetic mean height of a roughness curve) is several hundreds of nm to several μm. In a case where the range of the surface roughness is smaller than this range, an improvement of adhesion between the light diffusing portion 41 and the first substrate 39 cannot be expected. On the other hand, in a case where the range of the surface roughness is larger than this range, it is difficult to laminate a dry film resist (DFR) for forming the light diffusing portion 41.

Meanwhile, although not shown in the drawing, the entirety of the first surface 139a of the first substrate 39 is formed as an uneven surface, and accordingly, a substrate side end surface 40a of a light shielding layer 40 is also formed as an uneven surface. Thereby, a contact area of the light shielding layer 40 to the first surface 39a of the first substrate 39 is increased, and thus it is possible to further improve adhesion between the first substrate 39 and the light shielding layer 40.

[Liquid Crystal Display Device According to Second Embodiment]

Next, a liquid crystal display device according to the second embodiment will be described.

Figure 28:
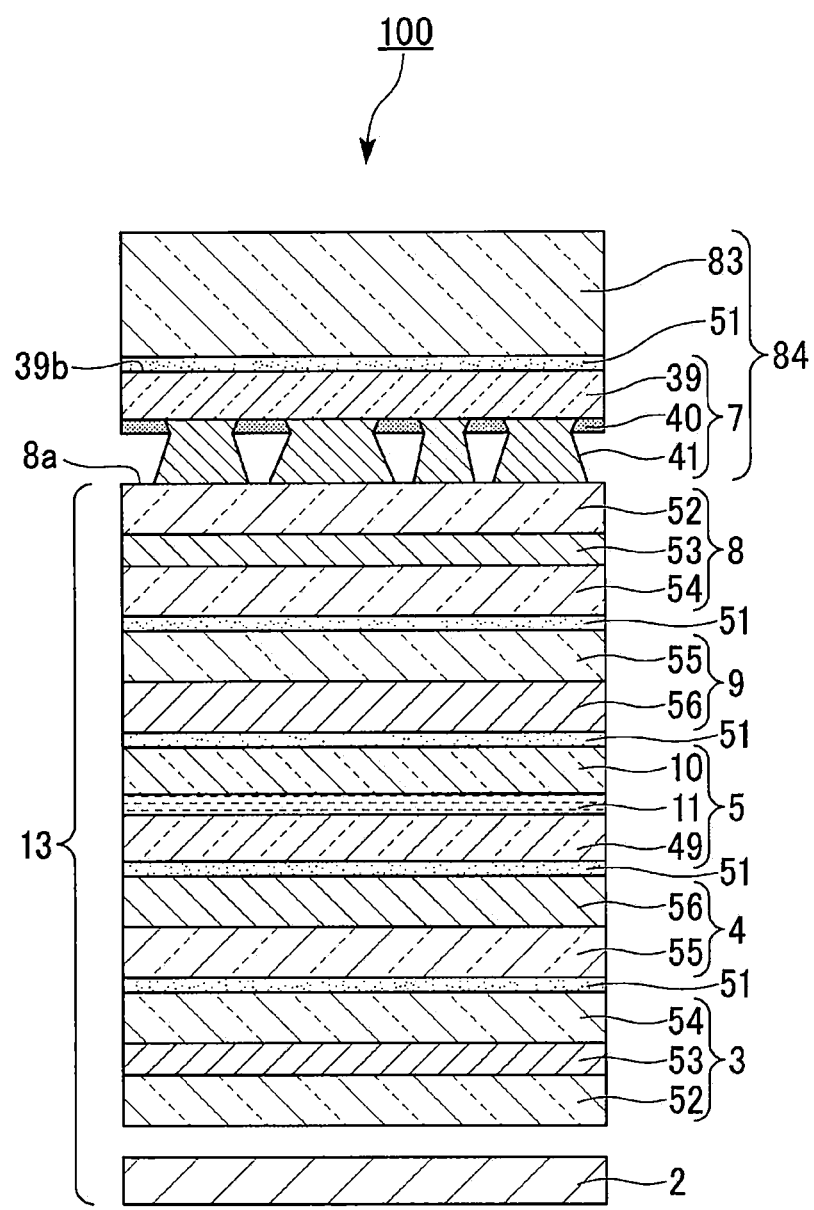
FIG. 28 is a diagram illustrating a schematic configuration of a liquid crystal display device according to the second embodiment.

FIG. 28 is a diagram illustrating a schematic configuration of a liquid crystal display device according to the second embodiment.

A liquid crystal display device 100 of this embodiment includes a light diffusing member 84 in which a rigid substrate (first substrate) 83 is bonded to a second surface 39b side of the first substrate 39 of a light diffusing film 7 through an adhesive layer (adhesion layer) 51, as illustrated in FIG. 28. The rigid substrate 83 has a molecular structure which is rigid and strong, and has excellent light transmissivity. For example, a glass substrate or the like can be used.

The light diffusing member 84 is manufactured in a process different from that of a liquid crystal display device unit 13, and the light diffusing member 84 is installed so as to be pressed against a surface (surface 8a of a second polarizing film 8) on a viewing side of the liquid crystal display device unit 13, thereby allowing a wide viewing angle of the liquid crystal display device 100 to be realized.

In this embodiment, the light diffusing member 84 and the liquid crystal display device unit 13 are not in contact with each other and are incorporated in a frame not shown in the drawing in a mutually contact state. Accordingly, the light diffusing member 84 and the liquid crystal display device unit 13 are not bonded to each other by an adhesive layer, thereby configuring the detachable light diffusing member 84.

[Liquid Crystal Display Device According to Third Embodiment]

Next, a liquid crystal display device according to a third embodiment will be described.

Figure 29:
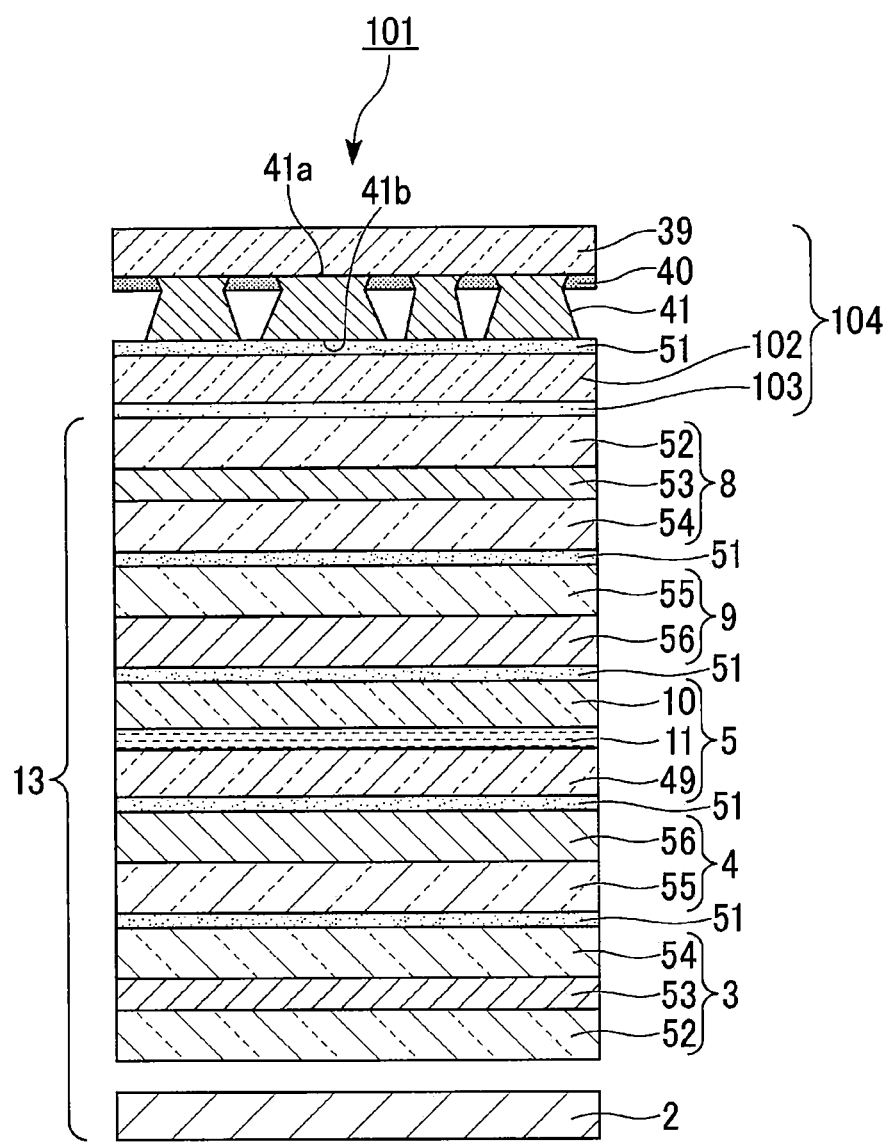
FIG. 29 is a diagram illustrating a schematic configuration of a liquid crystal display device according to a third embodiment.

FIG. 29 is a diagram illustrating a schematic configuration of the liquid crystal display device according to the third embodiment.

A liquid crystal display device 101 of this embodiment includes a light diffusing film 104 which is configured so as to be detachable from a liquid crystal display device unit (display unit) 13, as illustrated in FIG. 29.

The light diffusing film 104 includes a light diffusing film 104 in which a transparent substrate (first substrate) 102 which is bonded to a light incident end surface 41b side of a light diffusing portion 41 through an adhesive layer (first adhesion layer) 51 and an adhesive layer (second adhesion layer) 103 which is provided on a surface on a side opposite an adhesive layer 51 side of a transparent substrate 102 are bonded to each other.

An adhesive force of the adhesive layer 103 is weaker than an adhesive force of the adhesive layer 51. The adhesive layer 103 having such characteristics is used, and thus it is possible to configure the light diffusing film 104 which is detachable (repeelable) from a second polarizing film 8 of a liquid crystal display device unit 13.

A material having an adhesion of equal to or less than 0.1 N/25 mm in a peeling test of 180 degrees is appropriate for the material of the adhesive layer 103. In addition, a material capable of being optically bonded to a surface having irregularities of several like an anti-glare (AG) processed layer, is appropriately used. Examples of a transparent adhesive material satisfying such conditions include a silicon adsorption film, polyolefin-based elastomer, an acrylic-based fine-adhesive material, a urethane fine adhesive material, and the like.

A configuration of this embodiment is a configuration suitable for a case where the light diffusing film 104 bonded to the liquid crystal display device unit 13 is peeled, and is bonded again many times. It can be said that this configuration is a configuration in which it is possible to effectively apply a light diffusing film 7 having improved adhesiveness between a light diffusing portion 41 and a first substrate 39 by a light shielding layer 40 given an anchor function.

Up to here, although preferred embodiments according to the invention have been described with reference to the accompanying drawings, the invention is not limited thereto. It would be apparent for those skilled in the technical field to which the invention belongs that various modified examples or corrected examples are conceivable within the scope of the technical idea recited in the claims, and it would be understood that these fall within the technical scope of the invention. Configurations of the embodiments may be appropriately combined with each other.

INDUSTRIAL APPLICABILITY

An aspect of the invention can be used for various display devices such as a liquid crystal display device, an organic electroluminescence display device, a plasma display, an LED display, and a MEMS display.

REFERENCE SIGNS LIST 1, 100, 101 liquid crystal display device
6, 84, 104 light diffusing member
7, 97, 98 light diffusing film (light control member)
L parallel light (exposure light)
Q diffused light (exposure light)
13 liquid crystal display device unit (display unit)
85 exposure device
86 light diffusing film
39 first substrate
39a first surface
40, 43, 44, 45, 140 light shielding layer
40A, 43d, 44A, 45A enlarged portion
40a, 43a, 45a substrate side end surface
40b panel side end surface (enlarged portion)
41, 141 light diffusing portion
41a, 141a light emitting end surface
41b light incident end surface
51 adhesive layer (first adhesion layer)
51 adhesive layer (adhesion layer)
50 manufacturing apparatus (apparatus for manufacturing a light control member)
66B, 66C exposure and developing device (exposure device)

81 photomask
83 rigid substrate (first substrate)
87 inclination mechanism
102 transparent substrate (first substrate)
103 adhesive layer (second adhesion layer)
112 second roller (inclination mechanism)
141a light emitting end surface (contact surface)

The invention claimed is:

1. A light control member comprising:
a first substrate that transmits light;
a light diffusing portion which is defined on a first surface of the first substrate; and
a light shielding layer which is defined in a first region and is not defined in a second region in which the light diffusing portion is defined on the first surface, wherein
the light diffusing portion includes a first inclined surface and a second inclined surface, the first inclined surface being a forward tapered surface with respect to the second inclined surface, the second inclined surface being a reversely tapered surface,
the light diffusing portion includes a light emitting end surface being in contact with the first substrate, and a light incident end surface opposite the light emitting end surface and having a first area larger than a second area of the light emitting end surface, and is configured such that a height from the light incident end surface to the light emitting end surface is larger than a layer thickness of the light shielding layer, and
the light shielding layer includes an enlarged portion in a portion of the light shielding layer in a layer thickness direction, the enlarged portion being configured such that a sectional area which is cut by a plane parallel to the first surface is larger than a third area of a substrate side end surface of the light shielding layer.

2. The light control member according to claim 1, wherein an irregularity structure is provided in at least one of a first contact surface between the light emitting end surface and the first substrate and a second contact surface between the substrate side end surface and the first substrate.

3. A display device comprising:
a display; and
the light control member according to claim 2, the light control member being bonded to a light emission side of the display by an adhesion layer; wherein
the light control member emits light by extending a first distribution angle of light incident from the display farther than a second distribution angle of the light before incidence.

4. A display device comprising:
a display; and
the light control member according to claim 2, the light control member being provided at a light emission side of the display; wherein
the light control member emits light by extending a first distribution angle of light incident from the display farther than a second distribution angle of the light before incidence.

5. A display device comprising:
a display; and
the light control member according to claim 1, the light control member being bonded to a first light emission side of the display by a first adhesion layer, wherein the light control member emits light by extending a first distribution angle of light incident from the display farther than a second distribution angle of the light before incidence.

6. The display device according to claim 5, further comprising:
a second substrate that transmits light and is bonded to a first light incidence side of the light control member by a second adhesion layer, wherein
the display is bonded to a second light incidence side of the second substrate by second adhesion layer, and
a first adhesion of the second adhesion layer is lower than a second adhesion of the first adhesion layer.

7. The display device according to claim 5, further comprising:
a second substrate that transmits light, the second substrate being provided at a second light emission side of the light control member.

8. A display device comprising:
a display;
a light control member according to claim 1, the light control member being provided on a light emission side of the display wherein the light control member emits light by extending a first distribution angle of light incident from the display farther than a second distribution angle of the light before incidence.

9. The display device according to claim 8, further comprising:
a second substrate that transmits light, the second substrate being provided at a second light emission side of the light control member.

10. The light control member according to claim 1, wherein the first inclined surface tapers and the second inclined surface widens in a vertical direction of the first surface, the vertical direction extending from a light incident end surface side to a light emitting end surface side.

11. A method of manufacturing a light control member, the method comprising:
forming a light shielding layer on a first surface of a substrate that transmits light;
forming a negative type photosensitive resin layer on the first surface of the substrate so as to cover the light shielding layer;
radiating light from a second surface on a side opposite the first surface of the substrate; and
developing the negative type photosensitive resin layer for which irradiation with light has been completed, and forming a light diffusing portion on the first surface of the substrate, the light diffusing portion including a light emitting end surface on the first surface of the substrate and including a light incident end surface having a first area larger than a second area of the light emitting end surface on a side opposite the substrate side, wherein
the forming of the light shielding layer includes forming a light shielding layer including an enlarged portion in which a sectional area which is cut by a plane parallel to the first surface is larger than a third area of a substrate side end surface of the light shielding layer, and
the forming of the light diffusing portion includes forming a first inclined surface and a second inclined surface, the first inclined surface being a forward tapered surface with respect to the second inclined surface, the second inclined surface being a reversely tapered surface.

12. The method according to claim 11, wherein a light shielding layer material film having photosensitivity is formed on the first surface of the substrate as means for forming the light shielding layer having the enlarged portion, and the light shielding layer material film is irradiated with parallel light with an amount of underexposure to light through a photomask disposed on the first surface side of the substrate.

13. The method according to claim 11, wherein a light shielding layer material film having photosensitivity is formed on the first surface of the substrate as means for forming the light shielding layer having the enlarged portion, and the light shielding layer material film is irradiated with diffused light through a photomask disposed on a second surface side of the substrate.

14. The method according to claim 11, wherein a light shielding layer material film having photosensitivity is formed on the first surface of the substrate as means for forming the light shielding layer having the enlarged portion, the substrate having the light shielding layer material film formed thereon is disposed so as to be inclined from a direction perpendicular to an optical axis of exposure light, and the light shielding layer material film is irradiated with light through a photomask which is disposed on a second surface side of the substrate.

* * * * *